US007939837B2

(12) United States Patent
Lynch et al.

(10) Patent No.: US 7,939,837 B2
(45) Date of Patent: *May 10, 2011

(54) LED LUMINAIRE

(75) Inventors: Manuel Lynch, Tustin, CA (US);
Leonard Fraitag, San Diego, CA (US)

(73) Assignee: Permlight Products, Inc., Tustin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/315,766

(22) Filed: Dec. 5, 2008

(65) Prior Publication Data

US 2009/0086488 A1    Apr. 2, 2009

Related U.S. Application Data

(63) Continuation of application No. 11/496,341, filed on Jul. 31, 2006, now Pat. No. 7,582,911, which is a continuation of application No. 10/928,910, filed on Aug. 27, 2004, now Pat. No. 7,102,172.

(60) Provisional application No. 60/569,982, filed on May 10, 2004, provisional application No. 60/510,688, filed on Oct. 9, 2003.

(51) Int. Cl.
*H01L 33/00* (2010.01)

(52) U.S. Cl. ........... 257/88; 257/E33.054; 257/E33.057; 257/E33.075; 362/612; 362/218; 362/219; 362/249.02

(58) Field of Classification Search ............ 257/88, 257/E33.054, E33.057, E33.075; 362/612, 362/218, 219, 249
See application file for complete search history.

(56) References Cited

U.S. PATENT DOCUMENTS

| 3,936,686 | A | 2/1976 | Moore |
| 4,143,411 | A | 3/1979 | Roberts |
| 4,591,954 | A | 5/1986 | Kawamura et al. |
| 4,600,975 | A | 7/1986 | Roberts |
| 4,612,606 | A | 9/1986 | Roberts |
| 4,729,076 | A | 3/1988 | Masami et al. |
| 4,761,720 | A | 8/1988 | Solow |
| 4,855,882 | A | 8/1989 | Boss |
| 5,222,799 | A | 6/1993 | Sears |
| 5,226,053 | A | 7/1993 | Cho et al. |
| 5,278,432 | A | 1/1994 | Ignatius et al. |

(Continued)

FOREIGN PATENT DOCUMENTS

CN    1245521    2/2000

(Continued)

OTHER PUBLICATIONS

Hewlett Packard, Super Flux LED's pp. 1-25, 1-26, and ii.

(Continued)

*Primary Examiner* — Tu-Tu V Ho
(74) *Attorney, Agent, or Firm* — Knobbe, Martens, Olson & Bear LLP

(57) ABSTRACT

A modular light emitting diode (LED) mounting configuration is provided including a light source module having a plurality of pre-packaged LEDs arranged in a serial array. The module is connected to a heat dissipating plate configured to mount to an electrical junction box. Thus, heat from the LEDs is conducted to the heat dissipating plate and to the junction box. A sensor is configured to detect environmental parameters and a driver is configured to illuminate the LEDs in response to the environmental parameters, thereby selectively configuring the LEDs to function in a wide variety of useful applications.

13 Claims, 28 Drawing Sheets

U.S. PATENT DOCUMENTS

| | | | |
|---|---|---|---|
| 5,296,310 A | 3/1994 | Kibler et al. |
| 5,499,170 A | 3/1996 | Gagne |
| 5,607,227 A | 3/1997 | Yasumoto et al. |
| 5,635,814 A | 6/1997 | Afzal |
| 5,660,461 A | 8/1997 | Ignatius et al. |
| 5,697,175 A | 12/1997 | Schwartz |
| 5,746,497 A | 5/1998 | Machida |
| 5,783,909 A | 7/1998 | Hochstein |
| 5,785,411 A | 7/1998 | Komai et al. |
| 5,857,767 A | 1/1999 | Hochstein |
| 5,953,469 A | 9/1999 | Zhou |
| 5,958,572 A | 9/1999 | Schmidt et al. |
| 6,042,248 A | 3/2000 | Hannah et al. |
| 6,045,240 A | 4/2000 | Hochstein |
| 6,056,420 A | 5/2000 | Wilson |
| 6,075,701 A | 6/2000 | Ali et al. |
| 6,076,936 A | 6/2000 | George |
| 6,082,870 A | 7/2000 | George |
| 6,116,748 A | 9/2000 | George |
| 6,244,728 B1 | 6/2001 | Cote et al. |
| 6,249,267 B1 | 6/2001 | Ishihara |
| 6,250,774 B1 | 6/2001 | Begemann et al. |
| 6,283,612 B1 | 9/2001 | Hunter |
| 6,299,337 B1 | 10/2001 | Bachl et al. |
| 6,350,039 B1 | 2/2002 | Lee |
| 6,356,448 B1 | 3/2002 | DiBene, II et al. |
| 6,367,949 B1 | 4/2002 | Pederson |
| 6,396,466 B1 | 5/2002 | Pross et al. |
| 6,416,200 B1 | 7/2002 | George |
| 6,428,189 B1 | 8/2002 | Hochstein |
| 6,455,930 B1 | 9/2002 | Palanisamy et al. |
| 6,481,874 B2 | 11/2002 | Petroski |
| 6,483,254 B2 | 11/2002 | Vo |
| 6,485,160 B1 | 11/2002 | Sommers et al. |
| 6,502,968 B1 | 1/2003 | Simon |
| 6,505,956 B1 | 1/2003 | Priddy et al. |
| 6,509,840 B2 | 1/2003 | Martineau |
| 6,514,616 B1 | 2/2003 | Gandi et al. |
| 6,517,218 B2 | 2/2003 | Hochstein |
| 6,528,954 B1 | 3/2003 | Lys et al. |
| 6,536,913 B1 | 3/2003 | Yajima |
| 6,548,967 B1 | 4/2003 | Dowling et al. |
| 6,566,824 B2 | 5/2003 | Panagotacos et al. |
| 6,573,536 B1 | 6/2003 | Dry |
| 6,578,986 B2 | 6/2003 | Swaris et al. |
| 6,582,100 B1 | 6/2003 | Hochstein et al. |
| 6,582,103 B1 | 6/2003 | Popovich et al. |
| 6,641,283 B1 | 11/2003 | Bohler |
| 6,642,666 B1 | 11/2003 | St-Germain |
| 6,648,496 B1 | 11/2003 | Elghoroury et al. |
| 6,659,622 B2 | 12/2003 | Katogi et al. |
| 6,667,623 B2 | 12/2003 | Bourgault et al. |
| 6,712,486 B1 | 3/2004 | Popovich et al. |
| 6,713,862 B2 | 3/2004 | Palanisamy et al. |
| 6,731,222 B2 | 5/2004 | Martineau |
| 6,739,047 B2 | 5/2004 | Hammond et al. |
| 6,758,573 B1 | 7/2004 | Thomas et al. |
| 6,762,563 B2 | 7/2004 | St-Germain et al. |
| 6,787,999 B2 | 9/2004 | Stimac et al. |
| 6,796,698 B2 | 9/2004 | Sommers et al. |
| 6,799,864 B2 | 10/2004 | Bohler et al. |
| 6,815,724 B2 | 11/2004 | Dry |
| 6,846,093 B2 | 1/2005 | Swaris et al. |
| 6,871,983 B2 | 3/2005 | Jacob et al. |
| 6,880,952 B2 | 4/2005 | Kiraly et al. |
| 7,102,172 B2 | 9/2006 | Lynch et al. |
| 7,108,396 B2 | 9/2006 | Swaris et al. |
| 7,114,831 B2 | 10/2006 | Popovich et al. |
| 7,267,461 B2 | 9/2007 | Kan et al. |
| 7,306,353 B2 | 12/2007 | Popovich |
| 7,329,024 B2 | 2/2008 | Lynch et al. |
| 7,387,406 B2 | 6/2008 | Swaris et al. |
| 7,497,596 B2 | 3/2009 | Ge |
| 7,513,639 B2 | 4/2009 | Wang |
| 7,652,203 B2 | 1/2010 | Chang et al. |
| 7,654,703 B2 | 2/2010 | Kan et al. |
| 7,679,096 B1 | 3/2010 | Ruffin |
| 2001/0015891 A1 | 8/2001 | Suzuki et al. |
| 2001/0032985 A1 | 10/2001 | Bhat et al. |
| 2001/0039154 A1* | 11/2001 | Pierini et al. ................. 439/884 |
| 2003/0063463 A1 | 4/2003 | Sloan et al. |
| 2003/0072117 A1 | 4/2003 | Maekawa |
| 2003/0112627 A1 | 6/2003 | Deese |
| 2003/0189830 A1 | 10/2003 | Sugimoto |
| 2003/0218417 A1 | 11/2003 | Chin |
| 2004/0066142 A1 | 4/2004 | Stimac et al. |
| 2004/0188593 A1 | 9/2004 | Mullins |
| 2004/0190305 A1 | 9/2004 | Arik |
| 2005/0128751 A1 | 6/2005 | Roberge |
| 2007/0041220 A1 | 2/2007 | Lynch |
| 2008/0055915 A1 | 3/2008 | Lynch et al. |
| 2008/0192462 A1 | 8/2008 | Steedly |
| 2009/0059595 A1 | 3/2009 | Ge |

FOREIGN PATENT DOCUMENTS

| | | |
|---|---|---|
| EP | 0921568 | 6/1999 |
| EP | 1479286 | 11/2004 |
| WO | WO 97/37385 | 10/1997 |
| WO | WO 00/36336 | 6/2000 |

OTHER PUBLICATIONS

Hewlett Packard, Angeline Wong, Subminiarture InGaN Blue Lamps, pp. 1-2, Aug. 4, 1998.

Hewlett Packard, Subminiature High Performance AlInGaP LED Lamps, Technical Data, pp. 1-161-1-162.

Petroski, James, "Thermal Challenges Facing New Generation LEDs for Lighting Applications," in Solid State Lighting II, Proceedings of SPIE vol. 4776 (2002).

Thermal Management Considerations for Super Flux LEDs, Hewlett Packard, pp. 1-11.

Thermagon Catalog.

* cited by examiner

LED LUMINAIRE

RELATED APPLICATIONS

This application is a continuation of U.S. application Ser. No. 11/496,341, which was filed on Jul. 31, 2008, which is a continuation of U.S. application Ser. No. 10/928,910, which was filed on Aug. 27, 2004, which claims priority to U.S. Application Ser. Nos. 60/569,982, which was filed on May 10, 2004, and 60/510,688, which was filed on Oct. 9, 2003. The entirety of each of these applications is hereby incorporated by reference.

BACKGROUND OF THE INVENTION

1. Field of the Invention

The present invention relates generally to light emitting diode (LED) lighting devices and more particularly to a luminaire having a heat conductive body.

2. Description of the Related Art

Most lighting applications utilize incandescent or gas-filled bulbs, particularly lighting applications that require more than a low level of illumination. Such bulbs typically do not have long operating lifetimes and thus require frequent replacement. Gas-filled tubes, such as fluorescent or neon tubes, may have longer lifetimes, but operate using dangerously high voltages and are relatively expensive. Further, both bulbs and gas-filled tubes consume substantial amounts of power.

In contrast, light emitting diodes (LEDs) are relatively inexpensive, operate at low voltage, and have long operating lifetimes. Additionally, LEDs consume relatively little power and are compact. These attributes make LEDs particularly desirable and well suited for many applications.

Although it is known that the brightness of the light emitted by an LED can be increased by increasing the electrical current supplied to the LED, increased current also increases the junction temperature of the LED. Increased junction temperature may reduce the efficiency and the lifetime of the LED. For example, it has been noted that for every 10° C. increase in temperature above a specified temperature, the operating lifetime of silicone and gallium arsenide drops by a factor of 2.5-3. LEDs are often constructed of semiconductor materials that share many similar properties with silicone and gallium arsenide.

Accordingly, there is a need in the art for lighting systems utilizing LEDs and which evacuate heat to preserve LED lifetime.

SUMMARY OF THE INVENTION

In accordance with one embodiment, a lighting apparatus is provided. The apparatus comprises a light emitting diode (LED) module. The LED module has at least one LED, a dielectric member, and a plurality of electrically conductive contacts disposed on the dielectric member. The contacts are configured to mount the at least one LED to supply electrical current to the LED. The apparatus further comprises a heat conductive member and an electrical junction box. The junction box has a plurality of sides defining a cavity therewithin, and at least one of the sides has a knockout port configured to selectively provide access to the cavity. The LED module is in thermal communication with the heat conductive member, and the heat conductive member is attached to and in thermal communication with the junction box so that heat from the LED flows through the heat conductive member to the junction box.

In another embodiment, the heat conducting member is shaped generally complementary to the junction box front edge such that the heat conducting member is in thermal communication with at least a portion of the front edge.

In still another embodiment, the lighting apparatus further comprises a sensor for detecting a desired environmental parameter. The apparatus is further configured to send a corresponding signal to the driver, which is configured to drive the LEDs according to a desired lighting strategy in response to the signal.

In accordance with another embodiment, a method of making a lighting apparatus is provided. A light emitting diode (LED) module is provided. The module comprises at least one LED, a dielectric member, and a plurality of electrically conductive contacts disposed on the dielectric member. The contacts are configured to mount the at least one LED to supply electrical current to the LED. A heat conductive member is provided in thermal communication with the LED module. An electrical junction box having a plurality of sides defining a cavity and a front edge is provided. The heat conductive member is mounted onto the electrical junction box so that the heat conductive member is in thermal communication with the junction box.

In still another embodiment, the present invention provides a lighting apparatus, comprising: an LED module, a heat conductive member, and a power driver. The LED module has at least one LED, a dielectric member, and a plurality of electrically conductive contacts disposed on the dielectric member. The contacts are configured to mount the at least one LED so that an electrical current path is defined between a first contact and a second contact, and the at least one LED is disposed along the current path. The heat conductive member has a first side and a second side. The power driver is adapted to receive an electrical input power, condition the power to a desired power configuration, and output conditioned power. The LED module is attached to the first side of the heat conductive member and the power driver is attached to the second side of the heat conductive member, and the driver is electrically connected to the LED module so that conditioned power is supplied across the first and second contacts.

In another embodiment, a pair of fasteners connect the LED module to the first side of the heat conductive member. A fastener engages respective ones of the first and second contacts of the LED module, and herein electrical power from the driver is delivered through the fasteners to the LED module. In a still further embodiment, the driver comprises a pair of receivers adapted to output conditioned power, and the fasteners are adapted to engage the driver receivers so that power is supplied directly from the driver to the fasteners and further to the LED module.

DETAILED DESCRIPTION OF PREFERRED EMBODIMENTS

Figure 1:
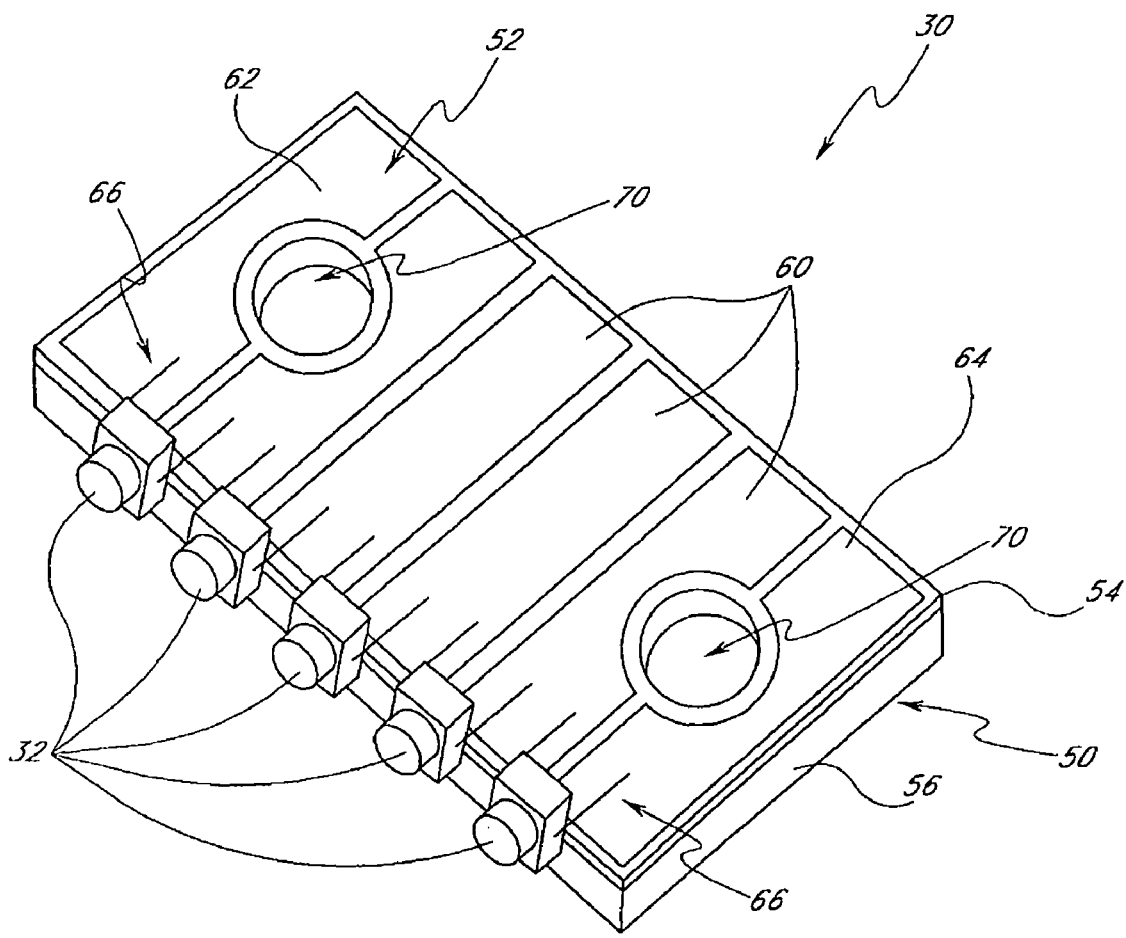
FIG. 1 is a perspective view of an LED module having features in accordance with an embodiment.

With reference first to FIG. 1, an embodiment of a light-emitting diode (LED) lighting module 30 is disclosed. In the illustrated embodiment, the LED module 30 includes five pre-packaged LEDs 32 arranged along a front edge of the module 30. It is to be understood, however, that LED modules can be constructed having any number of LEDs 32 mounted in any desired configuration.

Figure 2:
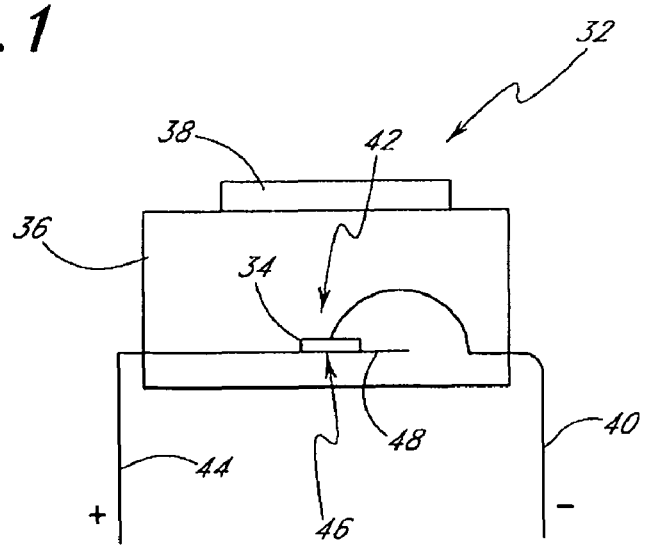
FIG. 2 is a schematic side view of a typical pre-packaged LED lamp.
Figures 3, 4:
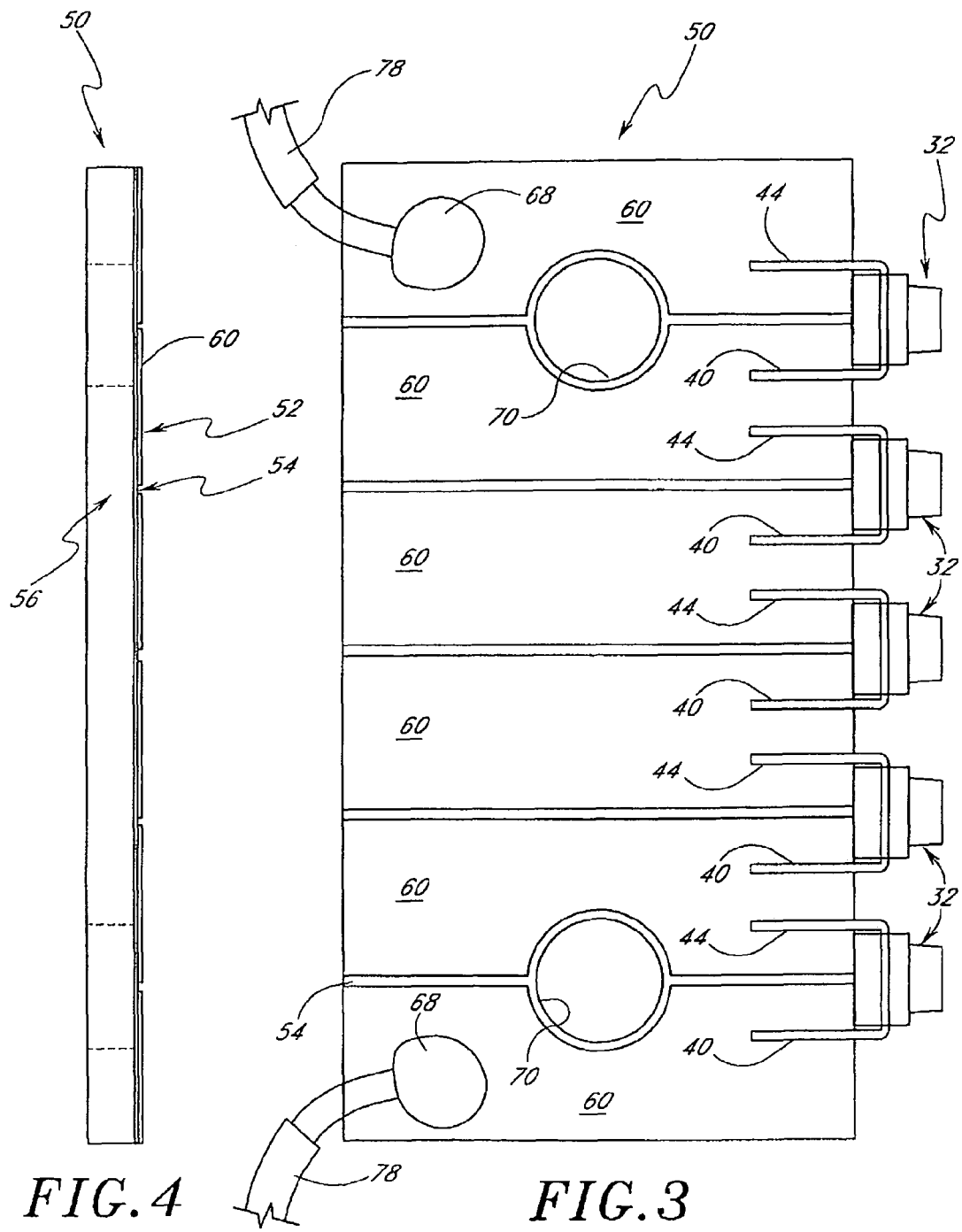
FIG. 3 is a top plan view of the LED module of FIG. 1.
FIG. 4 is a side plan view of the apparatus of FIG. 3.

With next reference to FIG. 2, a typical LED package 32 includes a diode chip 34 encased within a resin body 36. The LED package 32 typically has a focusing lens portion 38 on the body 36 and a pair of leads 40, 44, one of which is negative and the other positive. The negative lead 40 connects to an anode side 42 of the diode chip 34 and the positive lead 44 connects to a cathode side 46 of the diode chip 34. The positive lead 44 preferably includes a reflector portion 48 to help direct light from the diode 34 to the lens portion 38.

With next reference to FIGS. 1-5, the LED module 30 preferably comprises the five pre-packaged LED lamps 32 mounted in a linear array on a circuit board 50 and electrically connected in series. The LED lamps 32 may comprise Hewlett Packard model HLMT-PL00 lamps, which employ pre-packaged aluminum indium gallium phosphide (AlInGaP) chips 34. In the illustrated embodiment, each of the pre-packaged LEDs is substantially identical so that they emit the same color of light. It is to be understood, however, that nonidentical LEDs may be used to achieve certain desired lighting effects.

The illustrated circuit board 50 preferably is about 0.05 inches thick, 1 inch long and 0.5 inch wide. It includes three layers: a copper contact layer 52, an epoxy dielectric layer 54 and an aluminum main body layer 56. The copper contact layer 52 is made up of a series of six elongate and generally parallel flat copper plates 60 that are adapted to attach to the leads 40, 44 of the LEDs 32. Each of the copper contacts 60 is electrically insulated from the other copper contacts 60 by the dielectric layer 54. Preferably, the copper contacts 60 are substantially coplanar.

The pre-packaged LEDs 32 are attached to one side of the circuit board 50, with the body portion 36 of each LED generally abutting a side of the circuit board 50. The LED lens portion 38 is thus pointed outwardly so as to direct light in a direction substantially coplanar with the circuit board 50. The LED leads 40, 44 are soldered onto the contacts 60 in a manner to create a series array of LEDs. Excess material from the leads of the individual pre-packaged LED lamps may be removed, if desired. Each of the contacts 60, except for the first and last contact 62, 64, have both a negative lead 40 and a positive lead 44 attached thereto. One of the first and last contacts 62, 64 has only a negative lead 40 attached thereto; the other has only a positive lead 44 attached thereto.

A bonding area 66 of the contacts accommodates the leads 40, 44, which are preferably bonded to the contact 60 with solder 68; however, each contact 60 preferably has a surface area much larger than is required for bonding in the bonding area 66. The enlarged contact surface area allows each contact 60 to operate as a heat sink, efficiently absorbing heat from the LED leads 40, 44. To maximize this role, the contacts 60 are shaped to be as large as possible while still fitting upon the circuit board 50.

The dielectric layer 54 preferably has strong electrical insulation properties but also relatively high heat conductance properties, and is preferably as thin as practicable. For example in the illustrated embodiment, the dielectric layer 54 comprises a layer of Thermagon® epoxy about 0.002 inches thick.

It is to be understood that various materials and thicknesses can be used for the dielectric layer 54. Generally, the lower the thermal conductivity of the material used for the dielectric layer, the thinner that dielectric layer should be in order to maximize the heat transfer properties of the module. Nevertheless, even when a material such as Thermagon® epoxy, which has high thermal conductivity, is used, the dielectric layer is preferably as thin as practicable in order to minimize thermal resistance. Certain ceramic materials, such as beryllium oxide and aluminum nitride, are electrically non-conductive but highly thermally conductive. Such materials, and still other materials, can also be acceptably used for the dielectric layer.

In the illustrated embodiment, the main body 56 makes up the bulk of the thickness of the circuit board 50 and preferably comprises a flat aluminum plate. As with each of the individual contacts 60, the main body 56 functions as a heat conduit, absorbing heat from the contacts 60 through the dielectric layer 54 in order to conduct heat away from the LEDs 32. However, rather than just absorbing heat from a single LED 32, the main body 56 acts as a common heat conduit, absorbing heat from all of the contacts 60. As such, in the illustrated embodiment, the surface area of the main body 56 is about the same as the combined surface area of all of the individual contacts 60. The main body 56 can be significantly larger than shown in the illustrated embodiment, but its relatively compact shape is preferable in order to increase versatility when mounting the light module 30. Additionally, the main body 56 is relatively rigid and provides structural support for the lighting module 30.

In the illustrated embodiment, the main body 56 is made of aluminum, which has high thermal conductance properties and is easy to work with during manufacture. It is to be understood, however, that any material having advantageous thermal conductance properties, such as, for example, having thermal conductivity greater than about 75 watts per meter per Kelvin (W/m*K), or greater than about 100 W/m*K, would be acceptable.

In the illustrated embodiment, a pair of holes 70 are formed through the circuit board 50 and are adapted to accommodate a pair of aluminum pop rivets 72. The pop rivets 72 hold the circuit board 50 securely onto a heat conductive mount member 76. The mount member 76 functions as or communicates with a heat sink. Thus, heat from the LEDs 32 is conducted with relatively little resistance through the module 30 to the attached heat sink 76 so that the junction temperature of the diode chip 34 within the LED 32 does not exceed a maximum desired level.

With reference again to FIGS. 3 and 5, power supply wires 78 are attached across the first and last contacts 62, 64 of the circuit board 50 so that electrical current is provided to the series-connected LEDs 32. The power supply is preferably a 12-volt system and may be AC, DC or any other suitable power supply. A 12-volt AC system may be fully rectified. In another embodiment, the power supply is configured to supply constant current to the circuit board.

The small size of the LED module 30 provides versatility so that a plurality of modules can be mounted at various places and in various configurations. For instance, some applications will include only a single module for a particular lighting application, while other lighting applications will employ a plurality of modules electrically connected in parallel relative to each other.

It is also to be understood that any number of LEDs can be included in one module. For example, some modules may use two LEDs, while other modules may use 10 or more LEDs. One manner of determining the number of LEDs to include in a single module is to first determine the desired operating voltage of a single LED of the module and also the voltage of the power supply. The number of LEDs desired for the module is then roughly equal to the voltage of the power supply divided by the operating voltage of each of the LEDs.

The present LED module 30 rapidly conducts heat away from the diode chip 34 of each LED 32 so as to permit the LEDs 32 to be operated in regimes that exceed normal operating parameters of the pre-packaged LEDs 32. In particular, the heat sinks allow the LED circuit to be driven in a continuous, non-pulsed manner at a higher long-term electrical current than is possible for typical LED mounting configurations. This operating current is substantially greater than manufacturer-recommended maximums. The optical emission of the LEDs at the higher current is also markedly greater than at manufacturer-suggested maximum currents.

The heat transfer arrangement of the LED modules 30 is especially advantageous for pre-packaged LEDs 32 having relatively small packaging and for single-diode LED lamps. For instance, the HLMT-PL00 model LED lamps used in the illustrated embodiment employ only a single diode, but since heat can be drawn efficiently from that single diode through the leads and circuit board and into the heat sink, the diode can be run at a higher current than such LEDs are traditionally operated. At such a current, the single-diode LED shines brighter than many LED lamps that employ two or more diodes and which are brighter than a single-diode lamp during traditional operation. Of course, pre-packaged LED lamps having multiple diodes can also be advantageously employed with the present modular mounting arrangement. It is also to be understood that the relatively small packaging of the model HLMT-PL00 lamps aids in heat transfer by allowing the heat sink to be attached to the leads closer to the diode chip.

Figure 5:
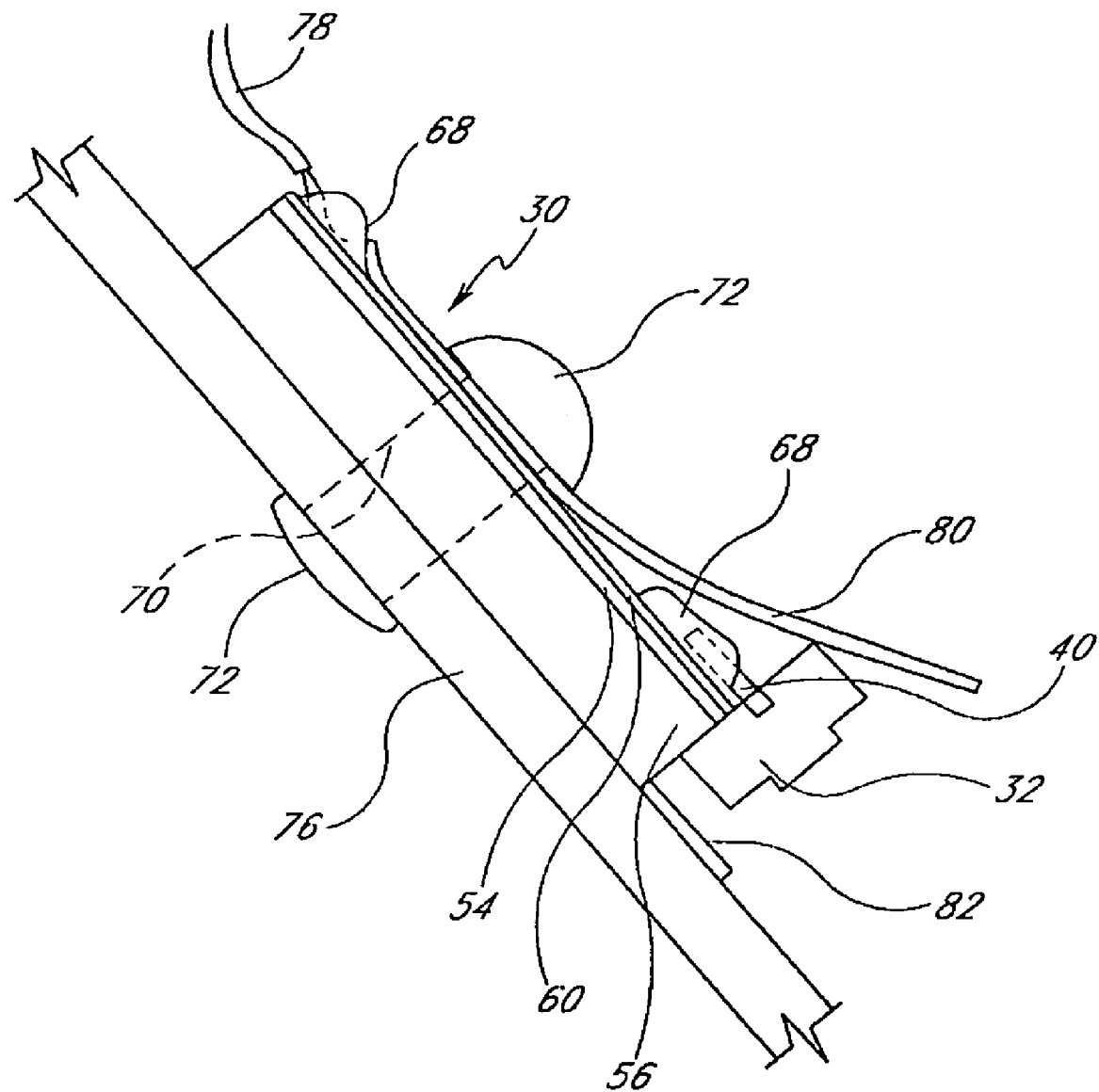
FIG. 5 is a close-up side view of the apparatus of FIG. 3 mounted on a heat conductive member.

With next reference to FIG. 5, a first reflective layer 80 is preferably attached immediately on top of the contacts 60 of the circuit board 50 and is held in position by the rivets 72. The first reflector 80 preferably extends outwardly beyond the LEDs 32. The reflective material preferably comprises an electrically non-conductive film such as visible mirror film, which is available from 3M. A second reflective layer 82 is preferably attached to the mount member 76 at a point immediately adjacent the LED lamps 32. The second strip 82 is preferably bonded to the mount surface 76 using adhesive in a manner known in the art.

Figure 6:
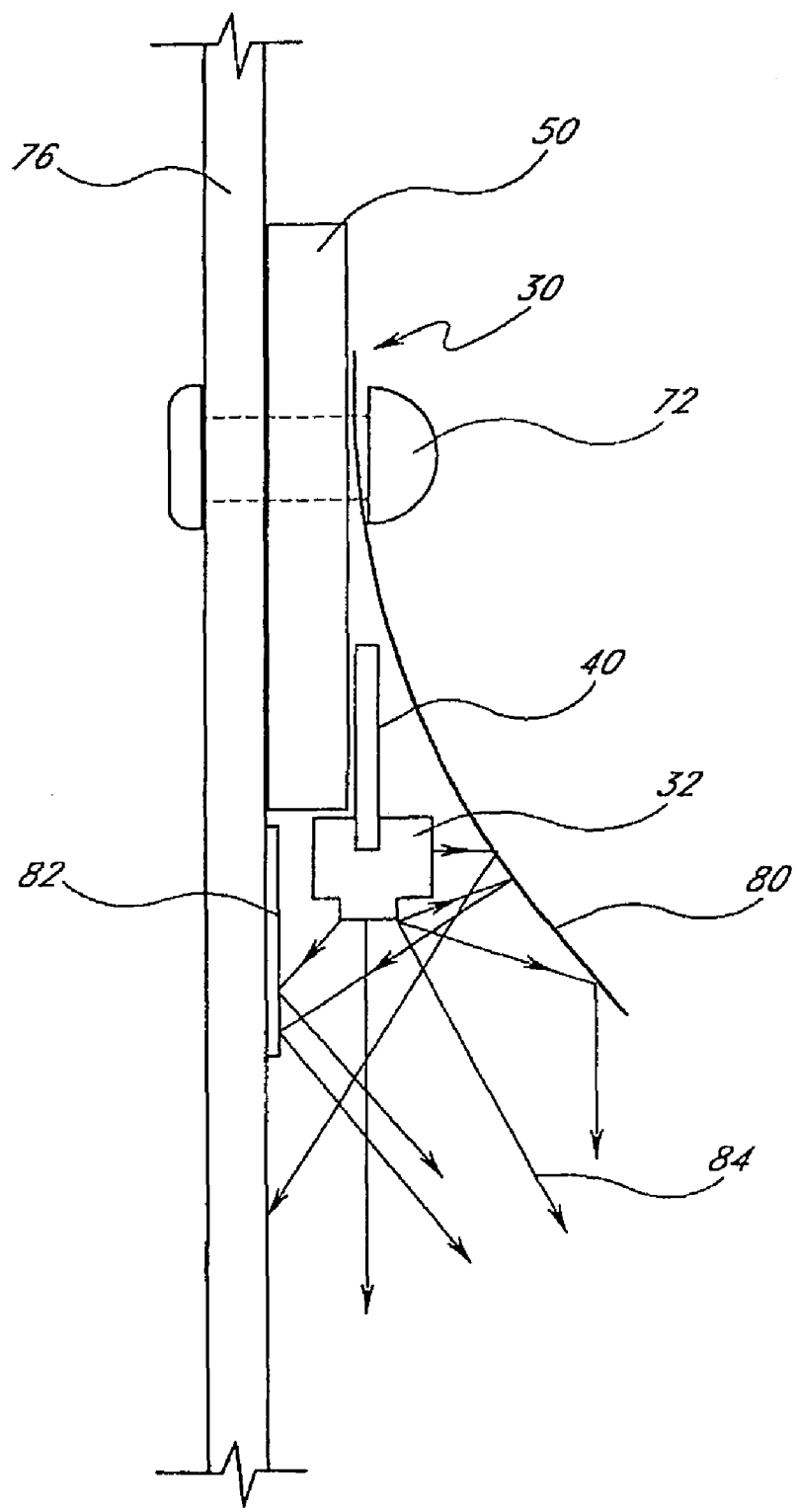
FIG. 6 is another sectional side view of the apparatus of FIG. 3 mounted onto a heat conductive flat surface.

With reference also to FIG. 6, the first reflective strip 80 is preferably bent so as to form a convex reflective trough about the LEDs 32. The convex trough is adapted to direct light rays emitted by the LEDs 32 outward with a minimum of reflections between the reflector strips 80, 82. Additionally, light from the LEDs is limited to being directed in a specified general direction by the reflecting films 80, 82. As also shown in FIG. 6, the circuit board 50 can be mounted directly to any mount surface 76.

In another embodiment, the aluminum main body portion 56 may be of reduced thickness or may be formed of a softer metal so that the module 30 can be at least partially deformed by a user. In this manner, the module 30 can be adjusted to fit onto various surfaces, whether they are flat or curved. By being able to adjust the fit of the module to the surface, the shared contact surface between the main body and the adjacent heat sink mount surface is maximized, thus improving heat transfer properties. Additional embodiments can use fasteners other than rivets to hold the module into place on the mount surface/heat sink material. These additional fasteners can include any known fastening means such as welding, heat-conductive adhesives, and the like.

Figure 7:
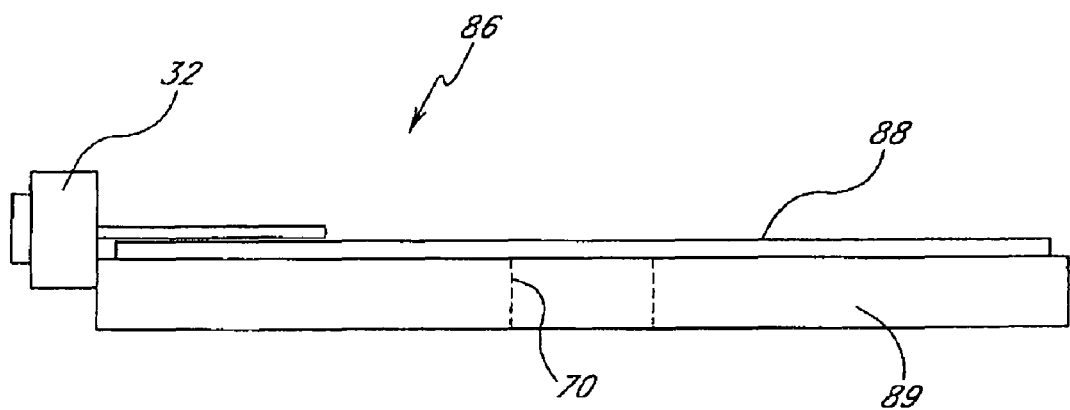
FIG. 7 is a side plan view of an LED module having features in accordance with another embodiment.

As discussed above, a variety of materials can be used for the circuit board portion of the LED module. With specific reference to FIG. 7, another embodiment of an LED module 86 comprises a series of elongate, flat contacts 88 similar to those described above with reference to FIG. 3. The contacts 88 are mounted directly onto the main body portion 89. The main body 89 comprises a rigid, substantially flat ceramic plate. The ceramic plate makes up the bulk of the circuit board and provides structural support for the contacts 88. Also, the ceramic plate has a surface area about the same as the combined surface area of the contacts. In this manner, the plate is large enough to provide structural support for the contacts 88 and to conduct heat away from each of the contacts 88, but is small enough to allow the module 86 to be relatively small and easy to work with. The ceramic plate 89 is preferably electrically non-conductive but has high heat conductivity. Thus, the contacts 88 are electrically insulated relative to each other, but heat from the contacts 88 is readily transferred to the ceramic plate 89 and into an adjacent heat sink.

Figure 8:
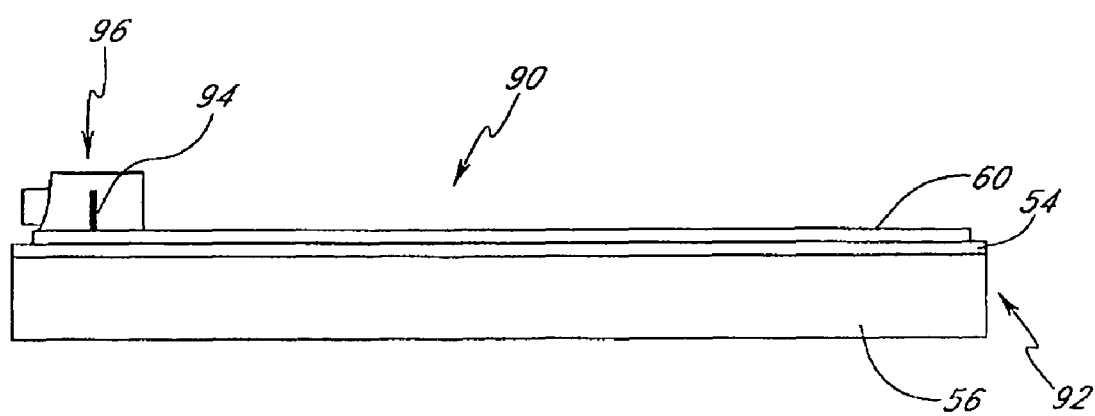
FIG. 8 is a side plan view of another LED module having features in accordance with yet another embodiment.

With next reference to FIG. 8, another embodiment of an LED lighting module 90 is shown. The LED module 90 comprises a circuit board 92 having features substantially similar to the circuit board 50 described above with reference to FIG. 3. The diode portion 94 of an LED 96 is mounted substantially directly onto the contacts 60 of the lighting module 90. In this manner, any thermal resistance from leads of pre-packaged LEDs is eliminated by transferring heat directly from the diode 94 onto each heat sink contact 60, from which the heat is conducted to the main body 56 and then out of the module 90. In this configuration, heat transfer properties are yet further improved.

With reference next to FIGS. 9-12, another embodiment of an LED module 100 is illustrated. As with the LED module 30 discussed above, the LED module 100 preferably comprises a circuit board 50 which includes a contact layer 52, a dielectric layer 54, and a main body layer 56. The contact layer 52 includes a series of electrical traces and contacts, as will be discussed in further detail below. The dielectric layer 54 electrically insulates the traces and contacts relative to one another. The main body layer 56 provides support and helps thermally conduct heat away from the contact layer 52 and dielectric layer 54.

Figure 9:
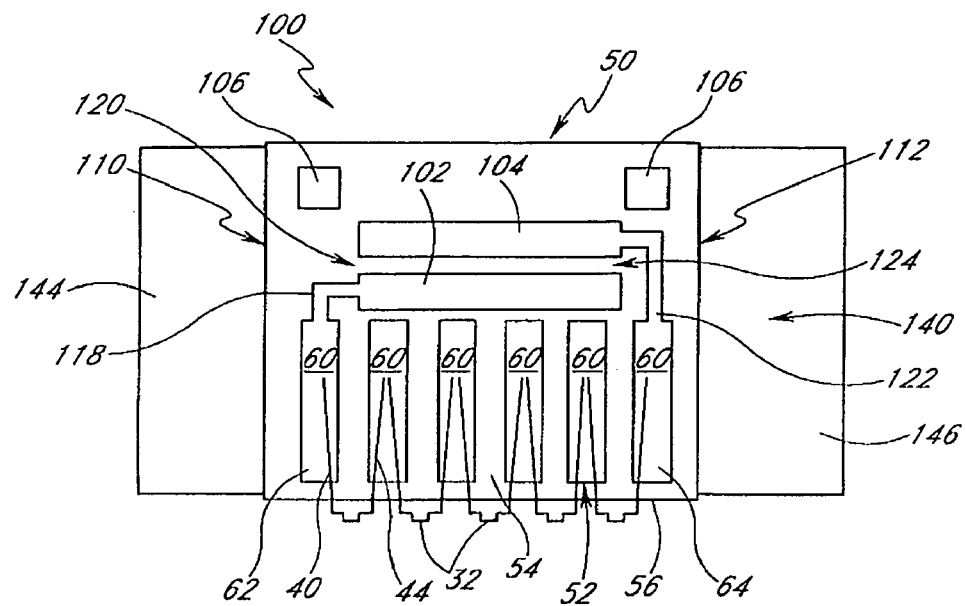
FIG. 9 is a plan view of yet another embodiment of an LED module.

As best shown in FIG. 9, which shows a plan view of the contact layer 52, the contact layer 52 comprises a series of six contacts 60, which comprise elongate and generally parallel electrically conductive flat plates. Leads 40, 44 of five LEDs 32 attach to the contacts 60 so as to form a linear array of the five prepackaged LEDs 32, which are arranged in series relative to one another.

First and second elongate power traces 102, 104 extend in a direction generally transverse to the parallel plates 60, but parallel to the series array. As with the contacts 60, the power traces 102, 104 comprise conductive material, and are electrically insulated from each other and the contacts by the dielectric layer 54. Secondary connecting portions 106 are also provided adjacent first and second side edges 110, 112 of the circuit board 50. The secondary connecting portions 106 are also electrically insulated from the contacts 60 and power traces 102, 104 by the dielectric layer 54.

A first connector trace 118 extends between the first contact 62 and a first end 120 of the first power trace 102. A second connection trace 122 extends between the last contact 64 and a second end 124 of the second power trace 104. The connector traces 118, 122 place their respective contacts 62, 64 into electrical communication with the corresponding power traces 102, 104.

Figure 10:
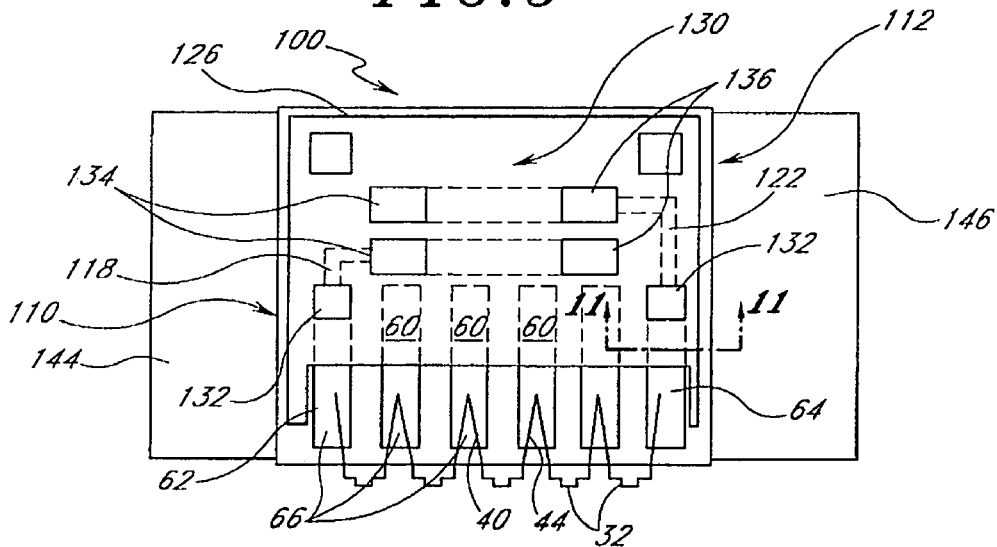
FIG. 10 shows the LED module of FIG. 9 including a masking layer.
Figure 11:
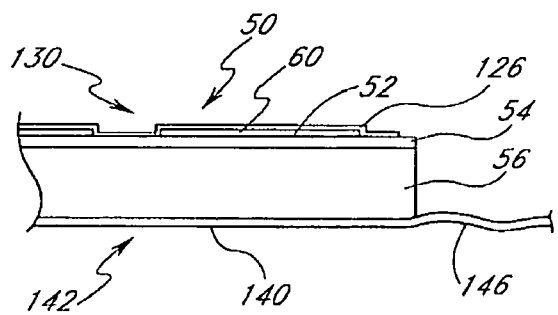
FIG. 11 is a sectional view of the LED module of FIG. 10 taken along line 11-11.

FIG. 10 shows a view similar to FIG. 9, except that a thin mask layer 126 is applied to selected portions of a top face 130 of the circuit board 50. FIG. 11 is a sectional view showing layers of the module 100. The masking layer 126 covers certain portions of the contacts 60 and traces 102, 104, 118, 122. These covered portions are depicted in phantom lines in FIG. 10. Other portions of the contacts and traces are left uncovered in order to function as solder points so as to facilitate electrical connection with certain other components. The masking layer 126 fulfills an aesthetic function and also protects areas of the contacts that are not used for electrical connections from environmental factors.

With continued reference to FIGS. 10 and 11, the mask layer 126 covers a portion of each of the contacts 60. However, each of the contacts 60 has a connecting area 66 which is not covered and which accommodates the leads 40, 44 of the associated LEDs 32. A connecting portion 132 of both the first and last contacts 62, 64 is also not covered by the mask layer 126. The mask layer 126 covers portions of each power trace 102, 104. A first end connecting portion 134 of each power trace 102, 104 is provided at the end closest to the first side edge 110 of the circuit board 50. Similarly, a second end connecting portion 136 of each power trace 102, 104 is provided at the end closest to the second side edge 112 of the circuit board 50. The mask layer 126 does not cover the power traces in the connecting portions 134, 136. First and second flexible conductors such as wires 114, 116 (see FIG. 19) can be connected to the connecting portions 134, 136 in order to supply power to the LED array.

Figure 12:
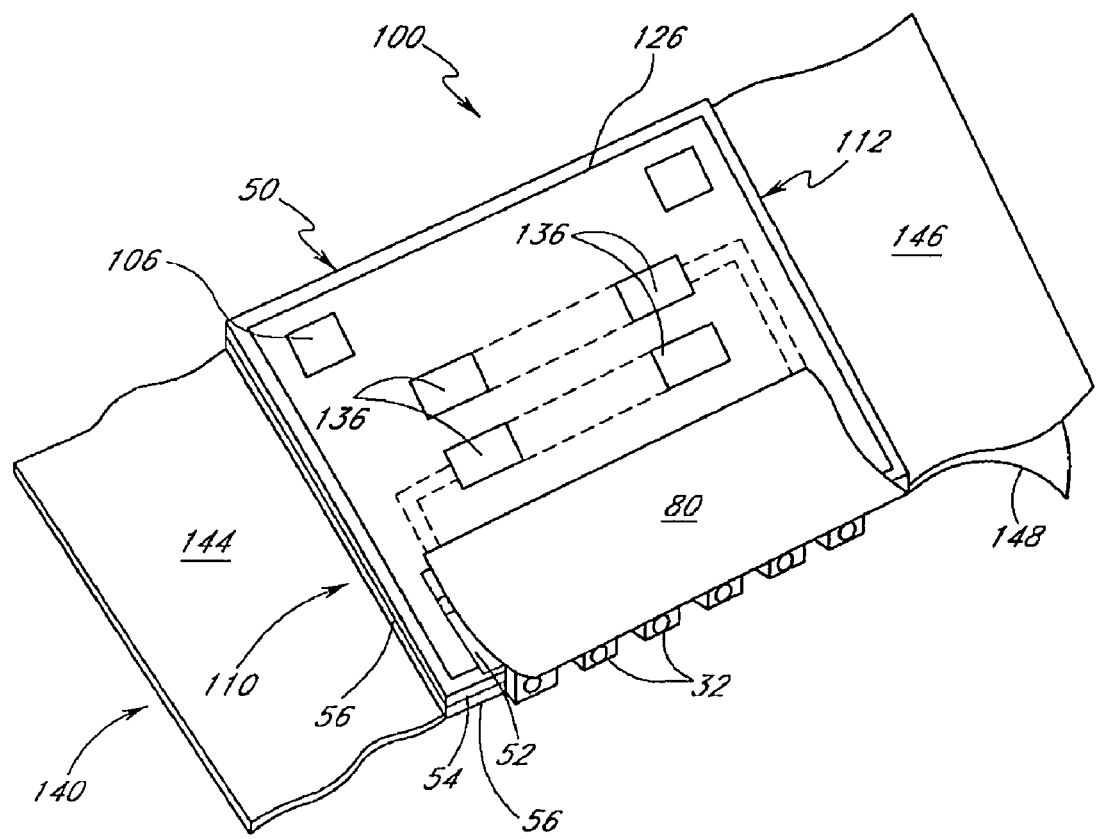
FIG. 12 is a perspective view of the LED module of FIG. 10, showing a reflective strip included thereon.

With reference also to FIG. 12, a layer of adhesive tape 140 is attached to a bottom face 142 of the LED module 100. As shown, the tape 140 preferably extends across the bottom face 142 and outwardly from the first and second opposing side edges 110, 112 of the circuit board 50, creating first and second flaps or ears 144, 146 of the tape 140. The tape 140 preferably is malleable and can be bent easily. A backing 148 is provided on the tape 140. The backing 148 can be peeled away to expose an adhesive layer, and the tape/module can be applied to a desired surface in a manner so that the module 100 is held securely in place on that surface.

A reflective layer 80 is also preferably attached to the circuit board 50. The reflective layer 80 is preferably held onto the circuit board 50 by a strip of adhesive operating between the mask layer 126 and the reflective cover 80. The reflective cover 80 preferably extends over the LEDs 32 in a manner as discussed above.

Figure 13:
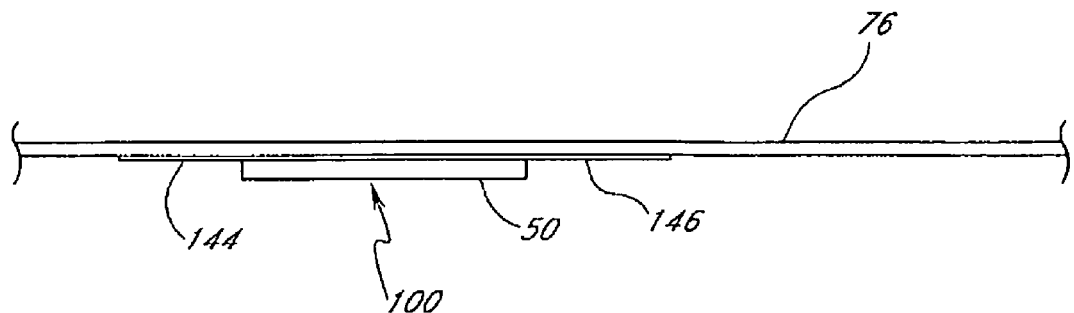
FIG. 13 is a side view of the LED module of FIG. 9 mounted on a flat surface.
Figure 14:
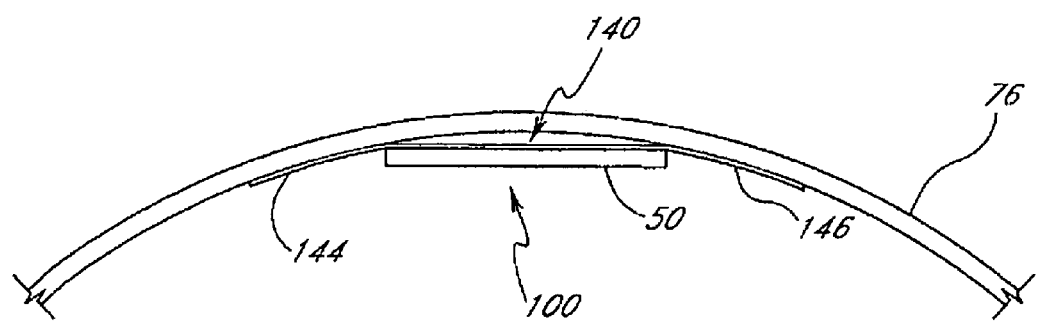
FIG. 14 is a close-up side view of the LED module of FIG. 9 mounted on a curving surface.

With next reference to FIGS. 13 and 14, the adhesive tape 140 secures a module 100 onto either a flat or a curved surface 76. In the case of a curved surface, if the module cannot bend sufficiently to keep the module in continuous contact with the curved surface, the flaps or ears of the tape will still be able to securely attach the module onto the curved surface. Of course, it is to be understood that the tape layer 140 can be provided with or without the ears 144, 146, and that the ears can be of any desired size and shape.

As mentioned, the LED module 100 has good heat transfer properties. The adhesive tape 140 preferably has properties that complement the heat transfer properties of the module. In one embodiment, the tape 140 comprises an aluminum tape having a heat-conductive adhesive applied thereto. The aluminum tape is capable of conforming to a curving or undulating surface, and also efficiently transfers heat from the module to the surface onto which it is attached. This aspect proves especially valuable when the module 100 is affixed to a curving heat sink surface 76, as shown in FIG. 14, and a large proportion of the module's circuit board 50 does not directly contact the curving surface. In such an instance, heat from the circuit board 50 flows through the ears 144, 146 to the heat sink 76.

In still another embodiment, the LED module's main body is formed of a bendable material, which allows the module to fit more closely and easily to a curved wall surface.

As discussed above, an LED module having features of the embodiments described above can be used in many applications such as, for example, indoor and outdoor decorative lighting, commercial lighting, spot lighting, and even room lighting. Such LED modules can also be used in applications using a plurality of such modules to appropriately light a lighting apparatus such as a channel illumination device 160 (see FIG. 15). Channel illumination devices are frequently used for signage including borders and lettering. In these devices, a wall structure outlines a desired shape to be illuminated, with one or more channels defined between the walls. A light source is mounted within the channel and a planar translucent diffuser is usually arranged at the top edges of the walls so as to enclose the channel. In this manner, a desired shape can be illuminated in a desired color as defined by the color of the lens and/or the LEDs.

Figure 15:
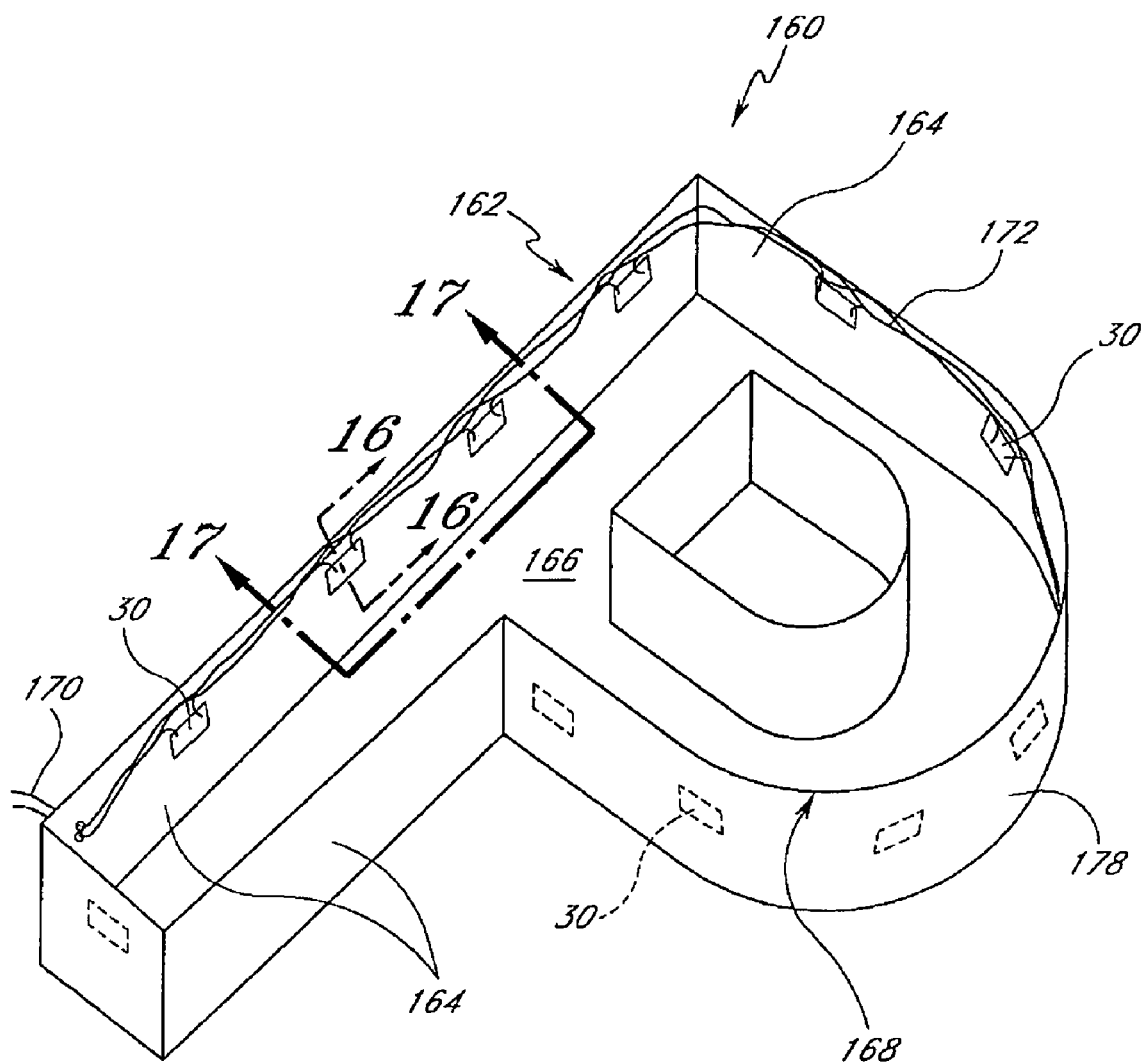
FIG. 15 is a perspective view of a channel illumination apparatus incorporating LED modules.

With reference next to FIG. 15, an embodiment of a channel illumination apparatus 160 is disclosed comprising a casing 162 in the shape of a "P." The casing 162 includes a plurality of walls 164 and a bottom 166, which together define at least one channel. The surfaces of the walls 164 and bottom 166 are diffusely-reflective, preferably being coated with a flat white coating. The walls 164 are preferably formed of a durable sturdy metal having relatively high heat conductivity. In the illustrated embodiment, a plurality of LED lighting modules 30 are mounted to the walls 164 of the casing 162 in a spaced-apart manner. A translucent light-diffusing lens (not shown) is preferably disposed on a top edge 168 of the walls 164 and encloses the channel.

Figure 16:
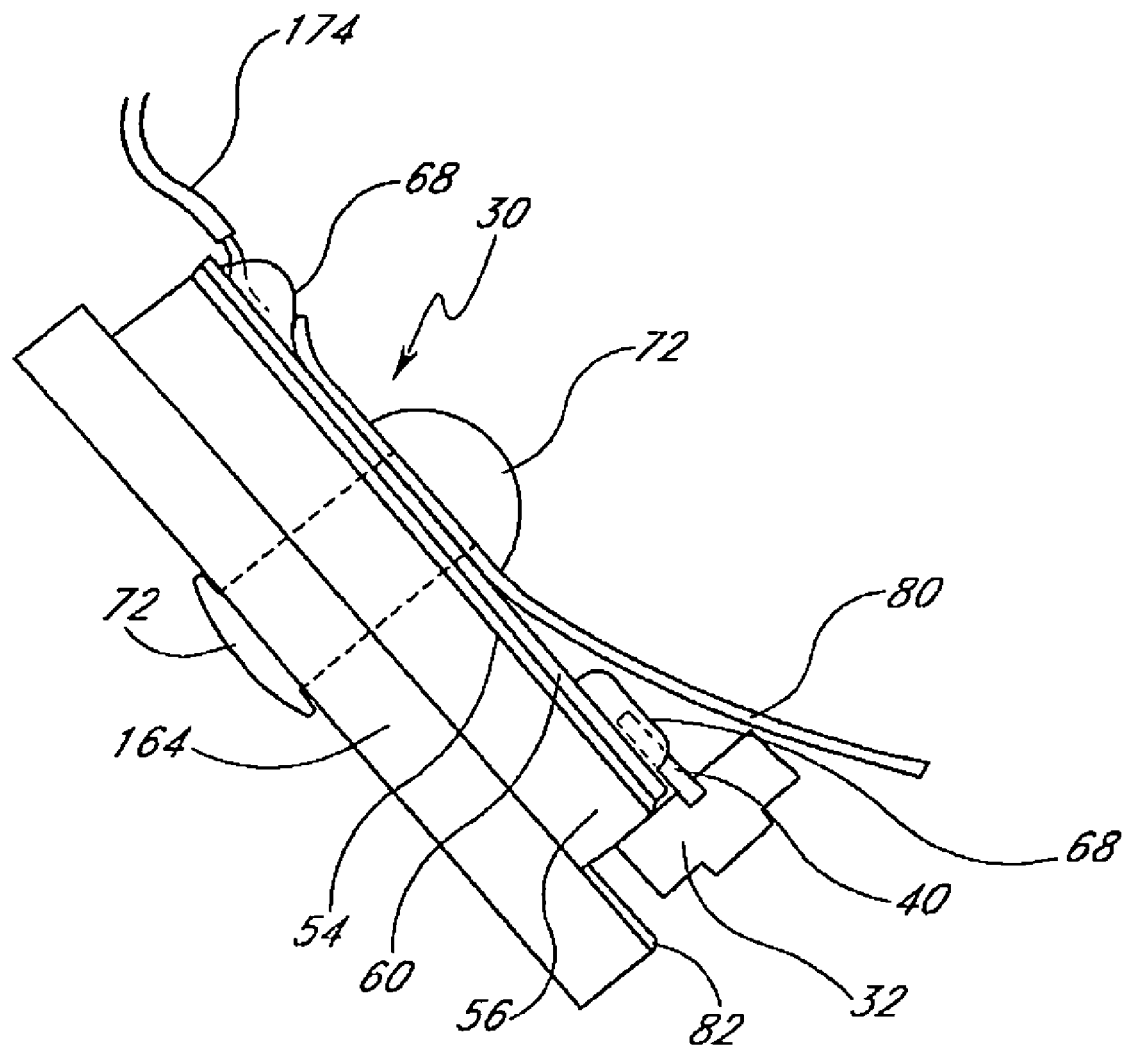
FIG. 16 is a cross-sectional side view taken along line 16-16 of FIG. 14.

With next reference also to FIG. 16, the LED module 30 is held securely onto the walls 164 of the channel apparatus by pop rivets 72, or any other fastening means. Preferably, the connection of the module 30 to the walls 164 facilitates heat transfer from the module 30 to the wall 164. The channel wall has a relatively large surface area, facilitating efficient heat transfer to the environment and enabling the channel wall 164 to function as a heat sink.

Figure 17:
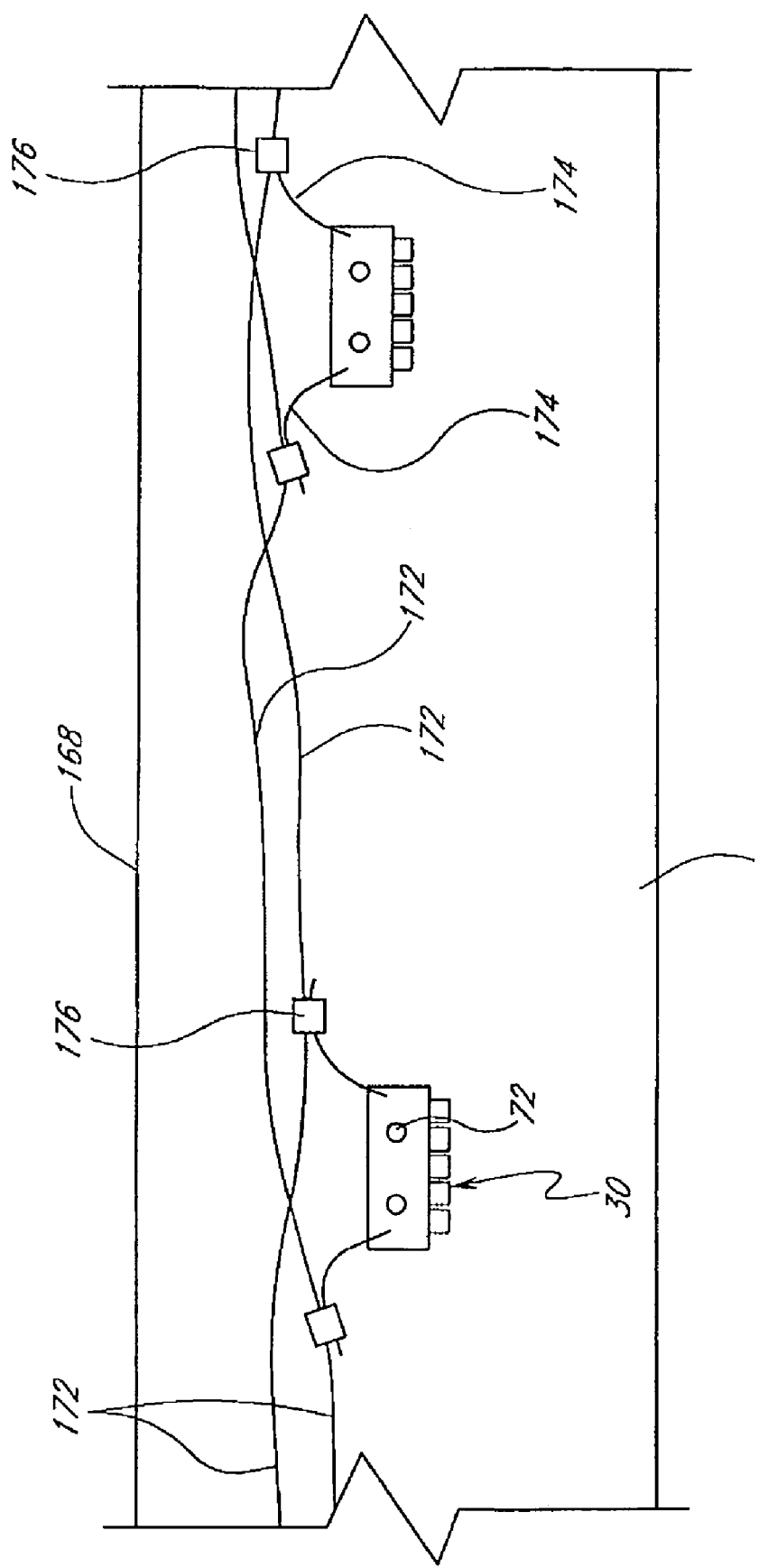
FIG. 17 is a partial view of a wall of the apparatus of FIG. 15, taken along line 17-17.

With continued reference to FIGS. 15-17, the LED modules 30 are preferably electrically connected in parallel relative to other modules 30 in the illumination apparatus 160. A power supply cord 170 preferably enters through one of the walls 164 or the bottom surface 166 of the casing 162 and preferably comprises two 18 AWG main conductors 172. Short wires 174 are attached to the first and last contacts 62, 64 of each module 30 and preferably connect with respective main conductors 172 using insulation displacement connectors (IDCs) 176 as shown in FIG. 17.

Although the LEDs 32 in the modules 30 are operated at electrical currents higher than typical pre-packaged LEDs, the power efficiency characteristic of LEDs is retained. For example, a channel illumination apparatus 160 using a plurality of LED modules might be expected to use about 4.5 watts of power.

With reference still to FIG. 17, the LED modules 30 are preferably positioned so that the LEDs 32 face generally downwardly, directing light away from the diffuser. The light is preferably directed to the diffusely-reflective wall and bottom surfaces 164, 166 of the casing 162. By directing the light away from the diffuser, "hot spots" that are associated with more direct forms of lighting, such as typical incandescent and gas-filled bulb arrangements, are avoided.

The reflectors 80, 82 of the LED modules 30 aid in directing light rays emanating from the LEDs toward the diffusely-reflective surfaces. It is to be understood, however, that an LED module 30 not employing reflectors, or employing only the first reflector 80, can also be appropriately used.

The relatively low profile of each LED module 30 facilitates the indirect method of lighting because substantially no shadow is created by the module when it is positioned on the wall 164. A higher-profile light module would cast a shadow on the lens, producing an undesirable, visibly darkened area. To minimize the potential of shadowing, it is desirable to space the modules 30 and accompanying power wires 172, 174 a distance of at least about ½ inch from the top edge 168 of the wall 164. More preferably, the modules 30 are spaced more than one inch from the top 168 of the wall 164.

Figure 18:
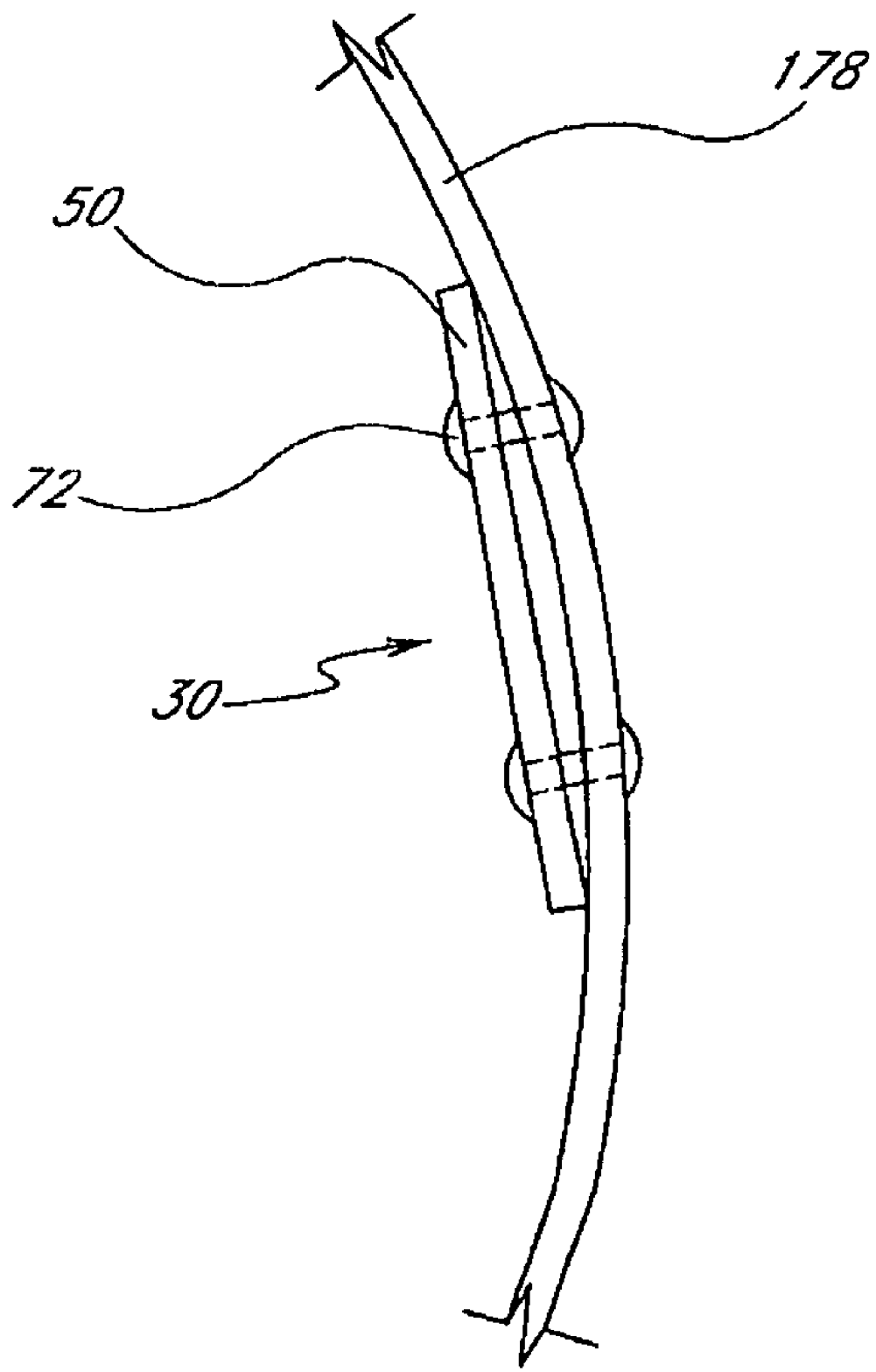
FIG. 18 is a top view of an LED module mounted to a wall of the apparatus of FIG. 15.

The small size and low profile of the LED modules 30 enables the modules to be mounted at various places along the channel wall 164. For instance, with reference to FIGS. 15 and 18, light modules 30 must sometimes be mounted to curving portions 178 of walls 164. The illustrated modules 30 are about 1 inch to 1½ inch long, and thus can be acceptably mounted to a curving wall 178.

In the embodiment shown in FIG. 15, the casing walls 164 are about 3 to 4 inches deep and the width of the channel is about 3 to 4 inches between the walls. In an apparatus of this size, LED modules 30 positioned on one side of the channel can provide sufficient lighting. The modules are preferably spaced about 5-6 inches apart. As may be anticipated, larger channel apparatus will likely require somewhat different arrangements of LED modules, including employing more LED modules. For example, a channel illumination apparatus having a channel width of 1 to 2 feet may employ LED modules on both walls and may even use multiple rows of LED modules. Additionally, the orientation of each of the modules may be varied in such a large channel illumination apparatus. For instance, some of the LED modules may desirably be angled so as to direct light at various angles relative to the diffusely reflective surfaces.

In order to avoid creating hot spots, a direct light path from the LED 32 to the diffuser preferably is avoided. However, it is to be understood that pre-packaged LED lamps having diffusely-reflective lenses may advantageously be directed toward the channel letter lens.

Individual LEDs emit generally monochromatic light. Thus, it is preferable that an LED type be chosen which corresponds to the desired illumination color of the lighting apparatus. Additionally, if a diffuser is used, the diffuser preferably is chosen to be substantially the same color as the LEDs. Such an arrangement facilitates desirable brightness and color results. It is also to be understood that the diffusely-reflective wall and bottom surfaces may be coated to match the desired illumination color.

Using LED modules 30 to illuminate a channel illumination apparatus 160 provides significant savings during manufacturing. For example, a number of LED modules, along with appropriate wiring and hardware, can be included in a kit which allows a technician to easily assemble a lighting apparatus by simply securing the modules in place along the wall of a casing and connecting the wiring appropriately using IDCs or the like. There is no need for custom shaping of the light source, as is required with gas-filled bulbs. Accordingly, manufacturing effort and costs are significantly reduced.

Of course, it is to be understood that LED modules having aspects of any of the embodiments of LED modules described above or below can be used in such a channel illumination apparatus, or similar devices.

Figure 19:
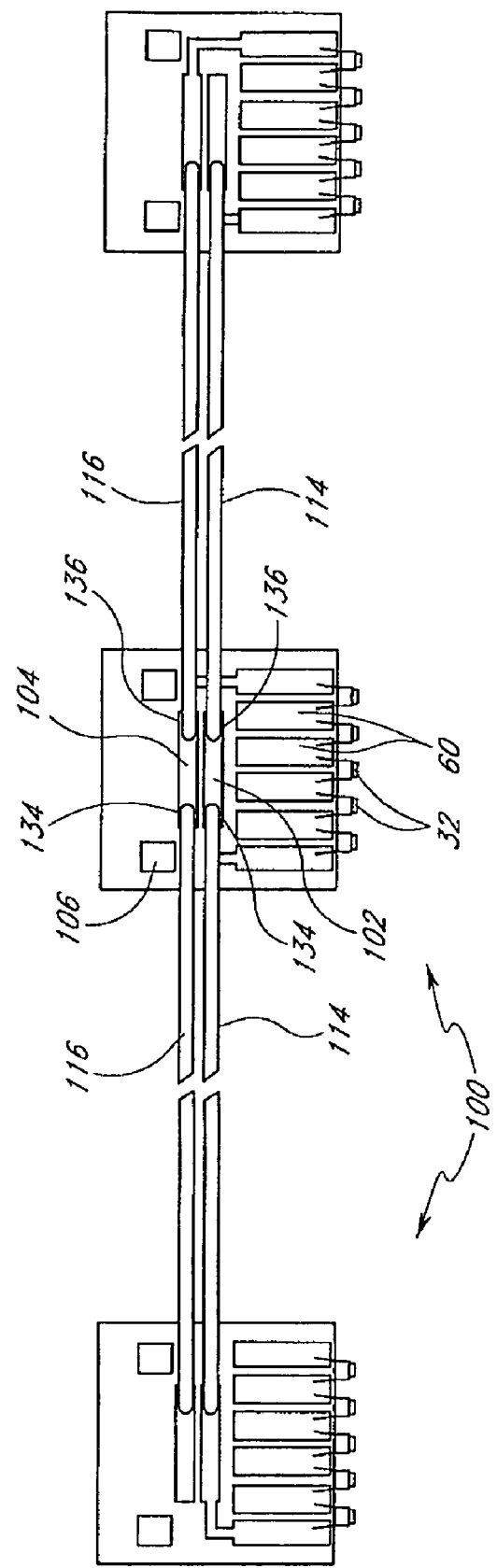
FIG. 19 shows a plurality of modules such as the LED module of FIG. 9 wired together.
Figure 20:
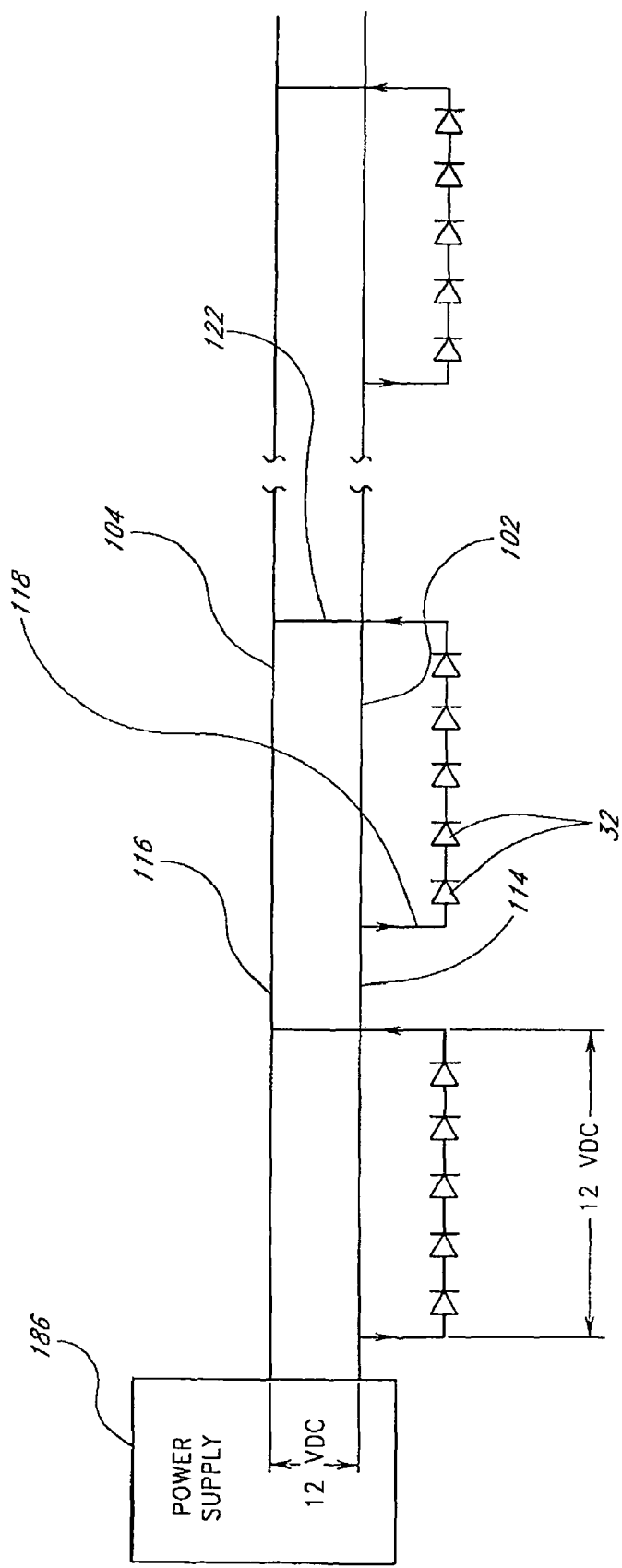
FIG. 20 is a circuit diagram showing the arrangement of FIG. 19 connected to a power supply.

With reference next to FIGS. 19 and 20, the power traces 102, 104 of the LED modules 100 discussed above with reference to FIGS. 9-14 are configured so that a plurality of modules 100 can easily be connected to one another by simply running a pair of relatively short wires 114, 116 between the power traces 102, 104 of each module 100 and soldering the wires 114, 116 in place on the power trace connecting portions 134, 136. As such, a plurality of LED modules 100 are wired together so that their corresponding LED series arrays are in an electrically parallel configuration.

With continued reference to FIG. 19, the wires 114, 116 preferably have the same length. As such, a plurality of modules 100 can be wired together to form a series or chain of such modules. Since the wires 114, 116 are the same length, the elongate series of modules is easy to mass produce with consistency. Preferably, the wires connect to the modules 100 at the connecting portions 134, 136 which are on generally opposing sides of the circuit board 50. In this manner, the module 100 is substantially longitudinally aligned with the associated flexible wires 114, 116. This arrangement provides a secure connection of the wires to the circuit board 50.

Figure 21:
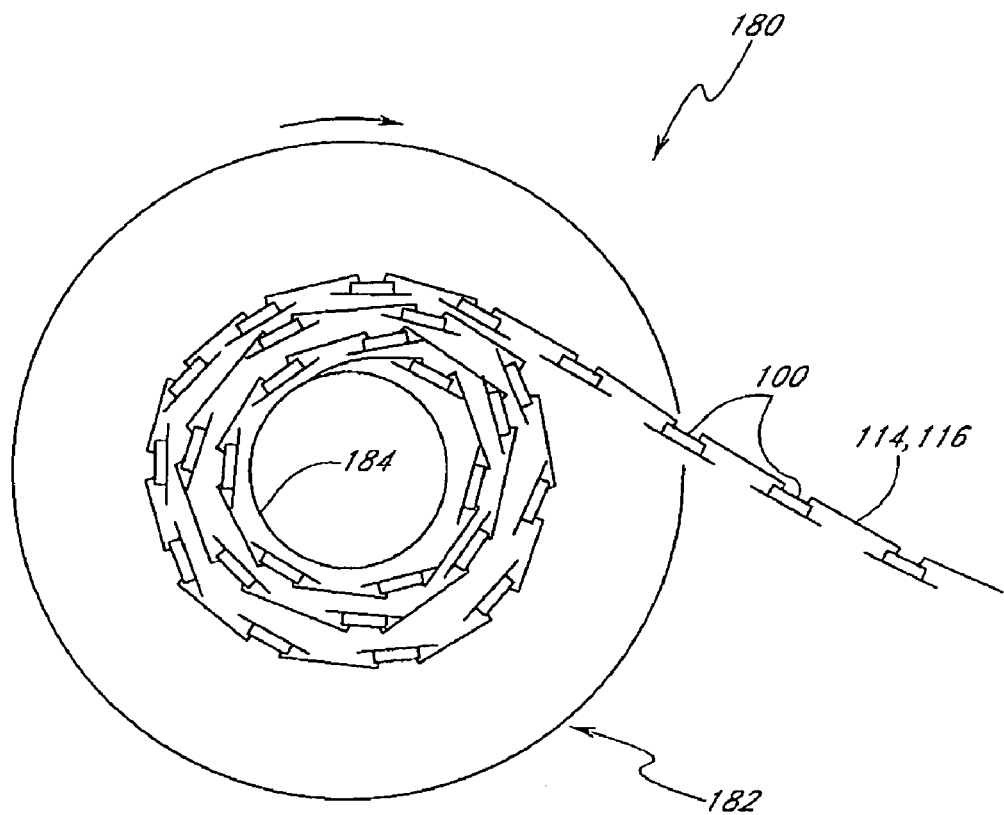
FIG. 21 is a side view of a plurality of wired-together LED modules such as the LED module of FIG. 9, arranged on a dispensing roll.
Figure 23:
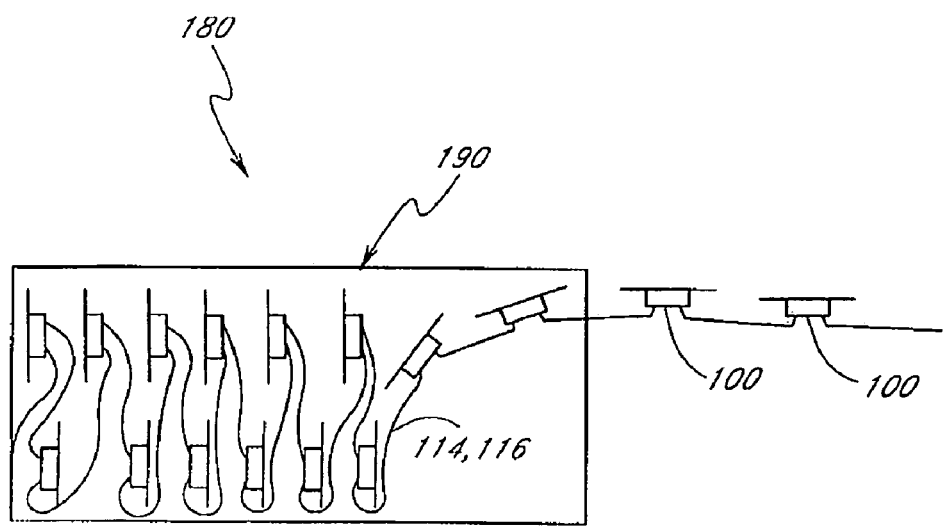
FIG. 23 is a plan view of a plurality of wired-together LED modules such as the LED module of FIG. 9, arranged within a box dispenser.
Figure 22:
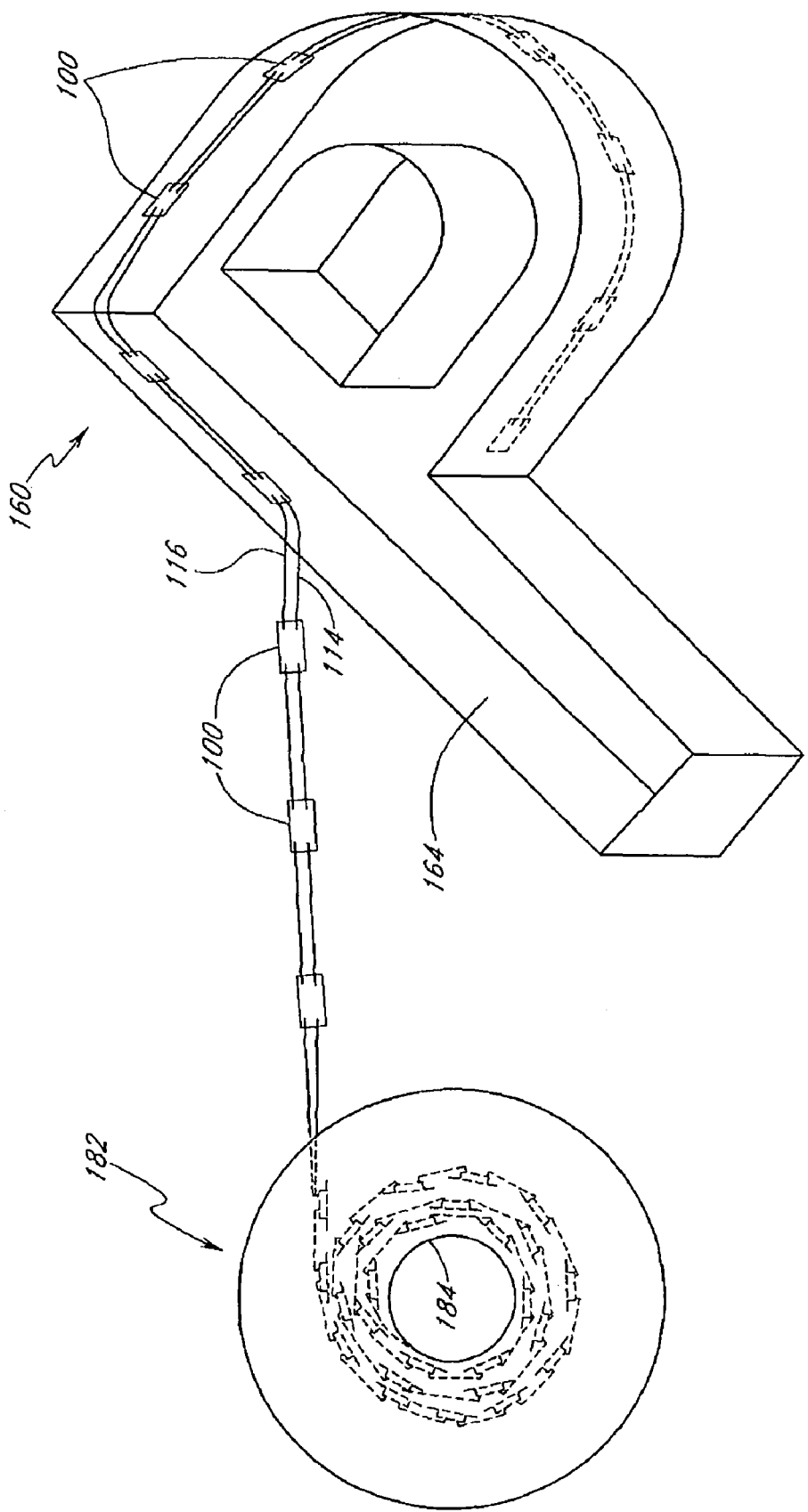
FIG. 22 shows wired-together modules from the dispensing roll of FIG. 21 being installed into a channel illumination apparatus.

With next reference to FIGS. 21-23, a plurality of modules 100, which have been wired together as shown in the embodiments of FIGS. 19 and 20, can be provided within a dispenser 180 to allow extremely easy and quick installation of the modules 100 into a light fixture such as a channel letter 160.

With reference specifically to FIGS. 21 and 22, a dispensing roll 182 can be provided having a multitude of such pre-wired LED modules 100 wound upon a roller 184. In order to install LED modules 100 within a channel letter 160 or other fixture, a worker will simply arrange the channel letter adjacent the roll 182 of LED modules, pull on the first available LED module 100 and secure the module, via its adhesive backing, in place on the wall 164 of the channel letter. As the module is pulled from the dispenser, adjacent connected modules are also drawn from the dispenser. Thus, once a module 100 is installed, another module 100, which is pre-wired together with the first module, is ready and waiting to be installed on the channel letter wall, as shown in FIG. 22. The worker thus progressively installs the pre-wired LED modules 100, and the dispensing roll 182 dispenses modules as required.

When the appropriate amount of LED modules 100 are installed, the worker simply snips the wires 114, 116, disconnecting the installed LED modules from the LED modules that are still on the dispensing roll 182. The wires 114, 116 of the installed modules are then connected to a power source 186 as depicted in FIG. 20. This method of installation is extremely fast. There is no need for the worker to perform soldering and there is very little wiring.

FIG. 23 shows another method and apparatus for dispensing a plurality of LED modules. In this embodiment, a box 190 or other type of dispenser is supplied in which a plurality of wired-together LED modules 100 are placed in an overlapping zigzag pattern. LED modules 100 are drawn from the dispenser as needed and unwind within the box dispenser 190 as they are drawn therefrom.

It is to be understood that, for both of the embodiments of FIGS. 21 and 23, a dispenser 180 can be provided that is sized to hold enough LED modules 100 to provide and satisfy the lighting needs of many channel letters 160 or other types of illumination devices so as to make manufacture of such devices efficient and easy. Such a dispenser could hold any desired number of modules. For example, a roller could be sized to hold 50, 100, 1000 or more modules in such a manner so that the interconnected modules do not become entangled.

Although the dispenser 180 is illustrated as a roller 182 or box 190, it is to be understood that any shape or form of dispenser can be used. In still another embodiment, the chain of wired-together modules can be coiled about itself rather than being wound about a roller.

While the preferred module 100 utilizes tape for securing the module to the surface, it will be understood that the above described dispensing arrangements may be used for modules that are not secured by tape, but by other means such as rivets, screws, glue, epoxy, etc.

Figure 24:
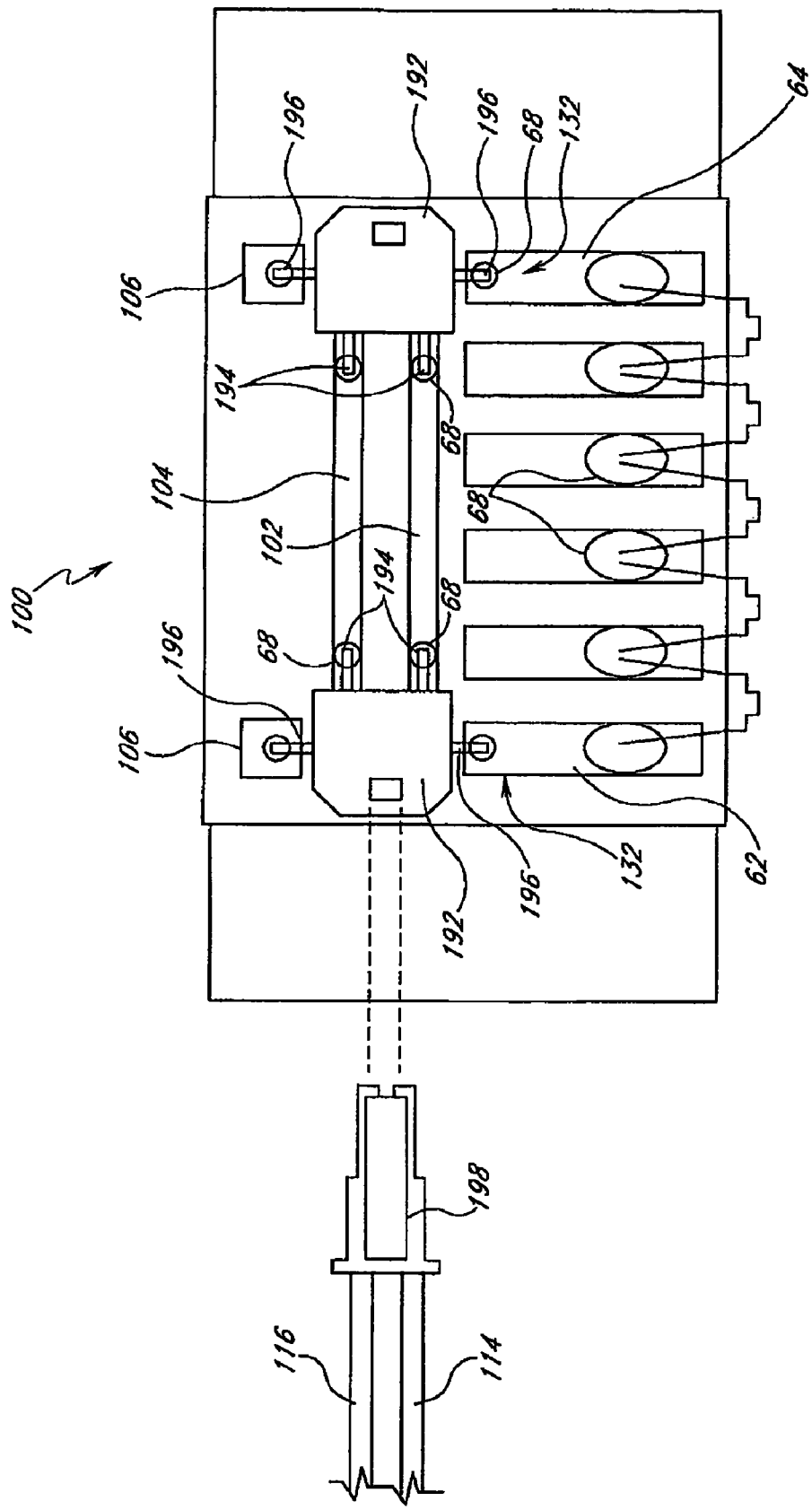
FIG. 24 is a plan view of an LED module having modular wire connectors.

In the embodiment illustrated in FIG. 19, the electrical supply wires 114, 116 are soldered directly onto the power trace connecting portions 134, 136. It is to be understood that, in other embodiments, connectors can be provided on the traces, and the wires themselves may have connecting members to mate with the connectors that are provided on the LED module. For instance, FIG. 24 shows an LED module 100 having modular connectors 192 placed thereon. Leads 194 of the connectors 192 are connected to the first and second power traces 102, 104 using solder 68. the connectors 192 are thus electrically connected to the contacts 60. Mounting portions 196 of the connectors 192 engage and are soldered to the contact connecting portions 132 and the secondary connecting portions 106 in order to more securely hold the connector 192 onto the LED modules 100. The modular connectors 192 are adapted to engage mating wire connectors 198. The wire connectors 198 are attached to the electrical supply wires 114, 116. Thus, when the connectors 192, 198 are engaged, the desired electrically parallel arrangement is maintained. In embodiments employing connectors, a channel letter or other illumination apparatus can be assembled by assembling modules and wire components as needed, and simply connecting these components via the connectors.

Certain preferred embodiments disclosed herein dissipate heat generated by the LEDs by placing a heat sink in thermal communication with the module. Heat dissipation is encouraged by using a thin dielectric layer in communication with a main body formed of a suitable material, such as aluminum, that exhibits a relatively high thermal conductivity. As disclosed above, the main body is preferably formed to have a surface area as large as a surface area of the array of contacts, or even slightly larger. This provides an LED module with a built-in heat sink which allows the LEDs to be driven at higher than recommended current levels. However, the main body need not be limited to the size of the plurality of contacts.

With reference next to FIGS. 25-31, another embodiment of an illumination apparatus 200 is presented. With particular reference to FIG. 25A, the LED luminaire 200 comprises a heat dissipating plate 202 having an LED lighting module 204 mounted thereon. A driver 206 is also mounted to the plate and is configured to control illumination of the LED module 204. A cover plate 208 fits onto the heat dissipating plate 202 generally over the LED module 204. Preferably, the assembled LED luminaire 200 is adapted to mount to a conventional electrical junction box 210. As such, the illustrated LED luminaire can function as a lighting fixture for home or commercial use.

Figure 25A:
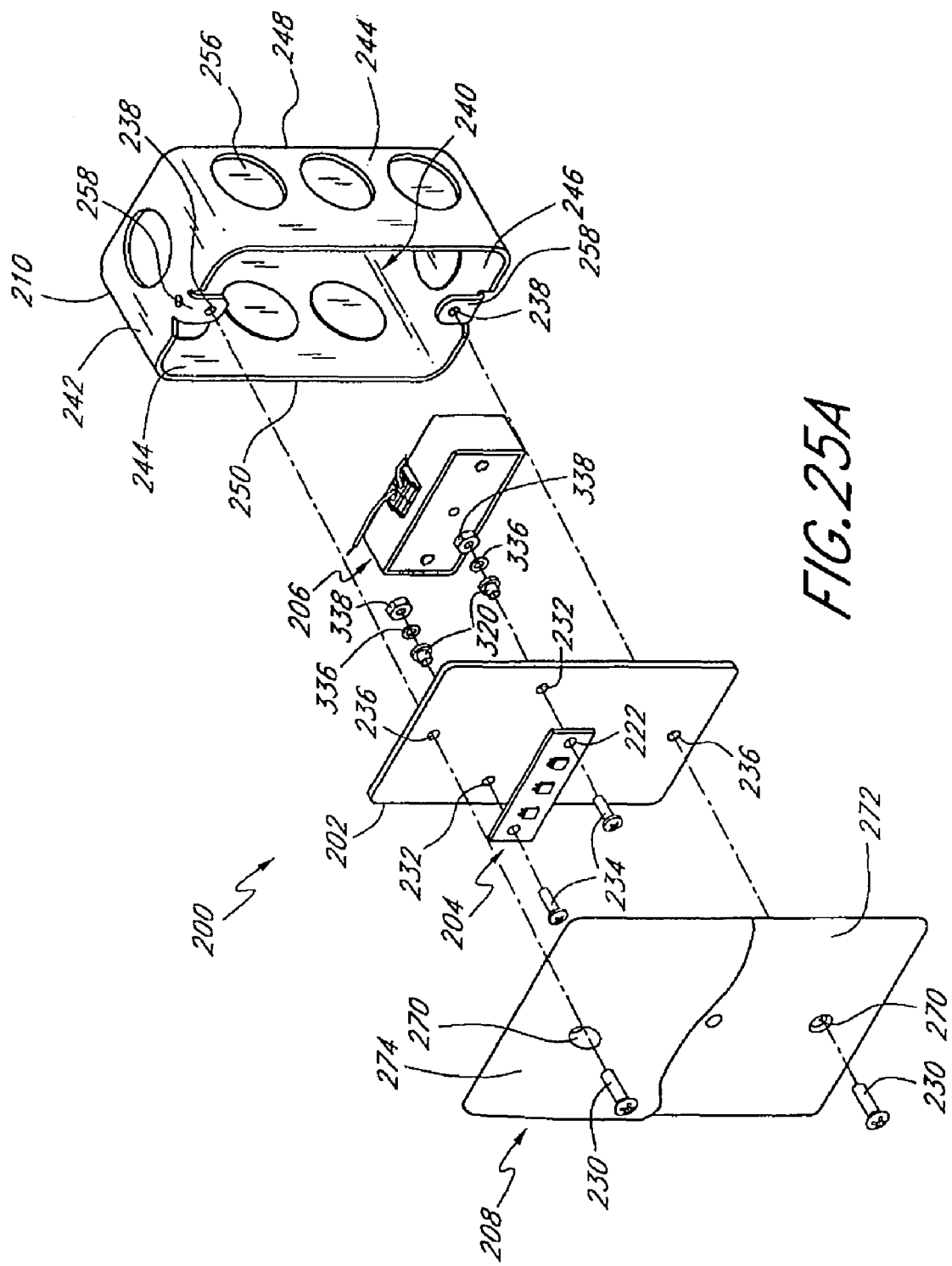
FIG. 25A is an exploded view of an LED luminaire configured for use with an electrical junction box.
Figure 25B:
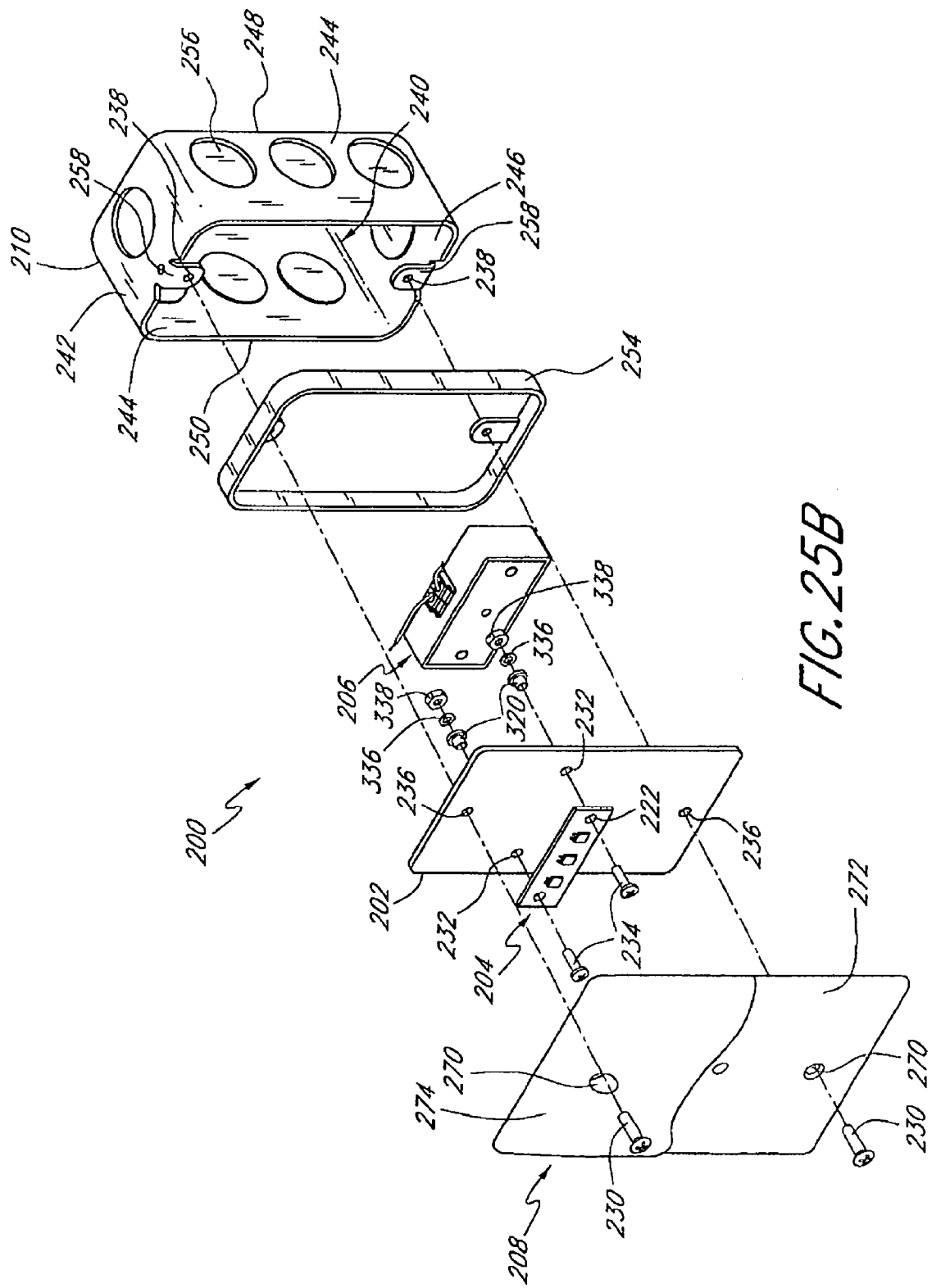
FIG. 25B is an exploded view of another embodiment of an LED luminaire configured for use with an electrical junction box.
Figure 26:
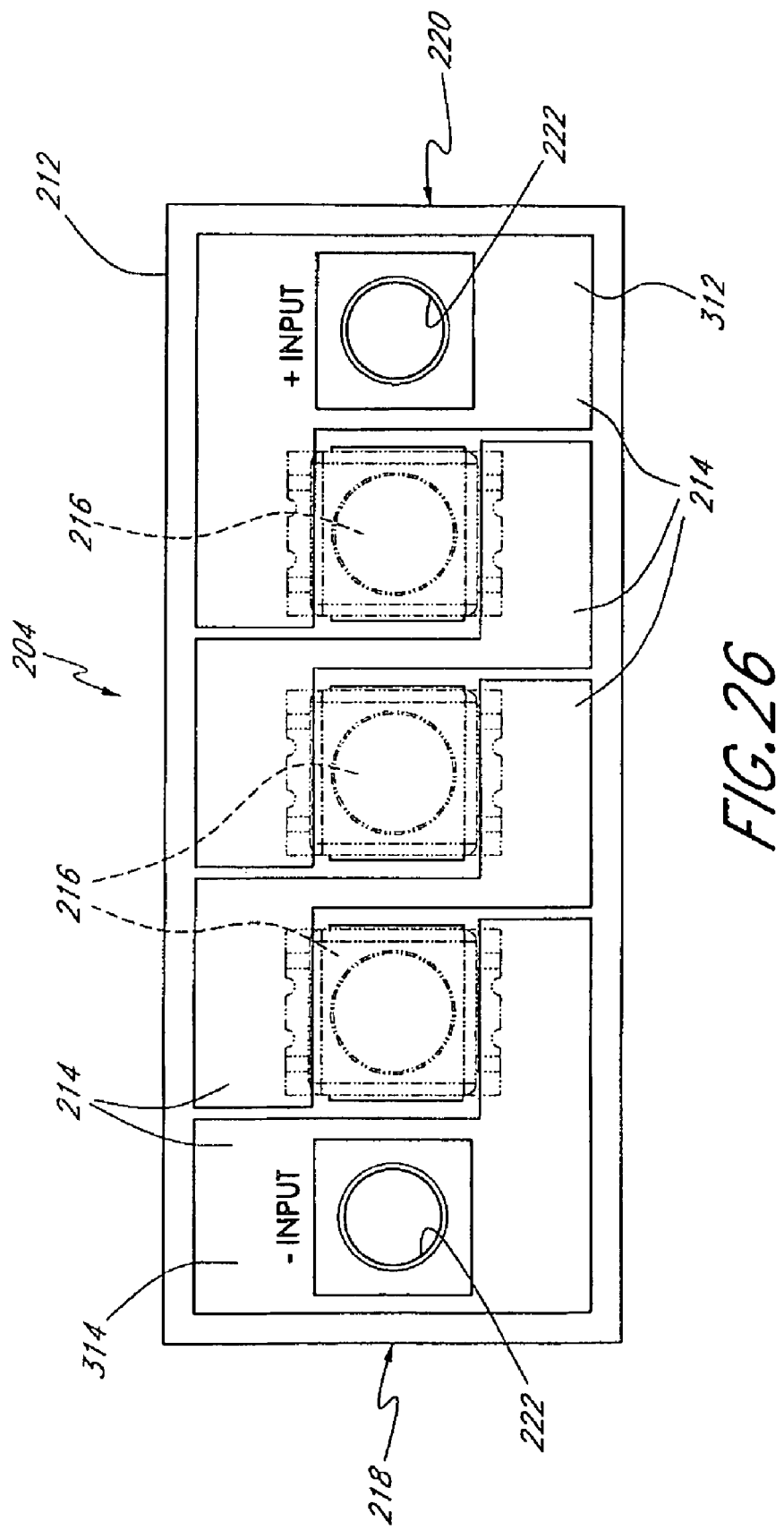
FIG. 26 shows an LED module configured to be used with the device of FIG. 25.

With particular reference to FIGS. 25A and 26, the lighting module 204 comprises an LED module having aspects similar to embodiments of LED modules 30 described above. In the illustrated embodiment, the module 204 comprises a heat conductive body 212 having a dielectric layer. Contacts 214 are provided on the dielectric layer opposite the heat conductive body 212, and LEDs 216 are attached to the contacts 214. The module 204 preferably is elongate, having first and second ends 218, 220. Mounting holes 222 are provided adjacent the first and second ends 218, 220. In the illustrated embodiment, the contacts 214 are electrically insulated from one another and are arranged so that three prepackaged LEDs can be mounted thereon in an electrically series array.

The illustrated LED module 204 presents a preferred embodiment for use in connection with the illustrated lighting apparatus 200. It is to be understood, however, that in other embodiments the contacts can be arranged so that the LEDs are electrically connected in parallel. Further, in the illustrated embodiment, only three LEDs 216 are provided on the module 204. In other embodiments, 1, 2, 4, 5 or more LEDs may be employed. Furthermore, LEDs may be combined with other electrical apparatus such as a heat or light sensor and associated circuitry. Further, the LEDs may be in a prepackaged and/or prefocused form or may comprise bare diodes.

With particular reference to FIGS. 25A and 29-31, the heat dissipating plate 202 preferably is much larger than the LED module 204. The heat dissipating plate 202 preferably is rectangle-shaped and formed of a suitable material, such as aluminum, that exhibits desirable heat transfer properties. As illustrated, the heat dissipating plate 202 is configured to be mounted to a commercially available electrical junction box 210, such as by screws 230.

In the illustrated embodiment, the heat dissipating plate 202 includes module mounting apertures 232 configured to allow mounting of an LED module 204 to the heat dissipating plate 202. The apertures 230 may be threaded to accommodate threaded fasteners 234. Of course, other types of fasteners could be used to provide a secure connection, as has been discussed in detail above, including rivets, adhesives and double-sided adhesive tape. Mounting of the LED module 204 to the plate 202 will be discussed in more detail below.

Figure 27A:
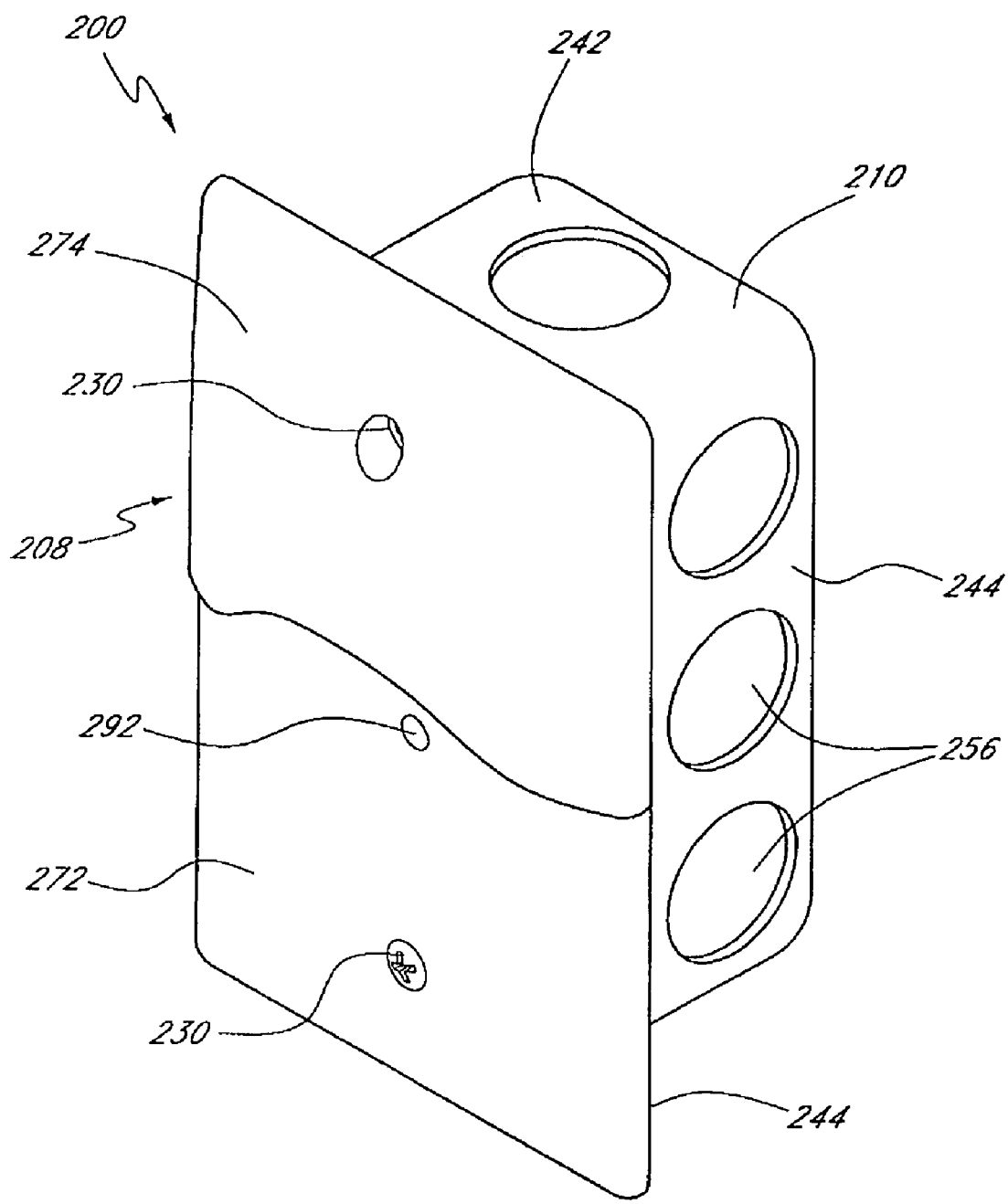
FIG. 27A is a perspective view of the assembled device of FIG. 25.
Figure 27B:
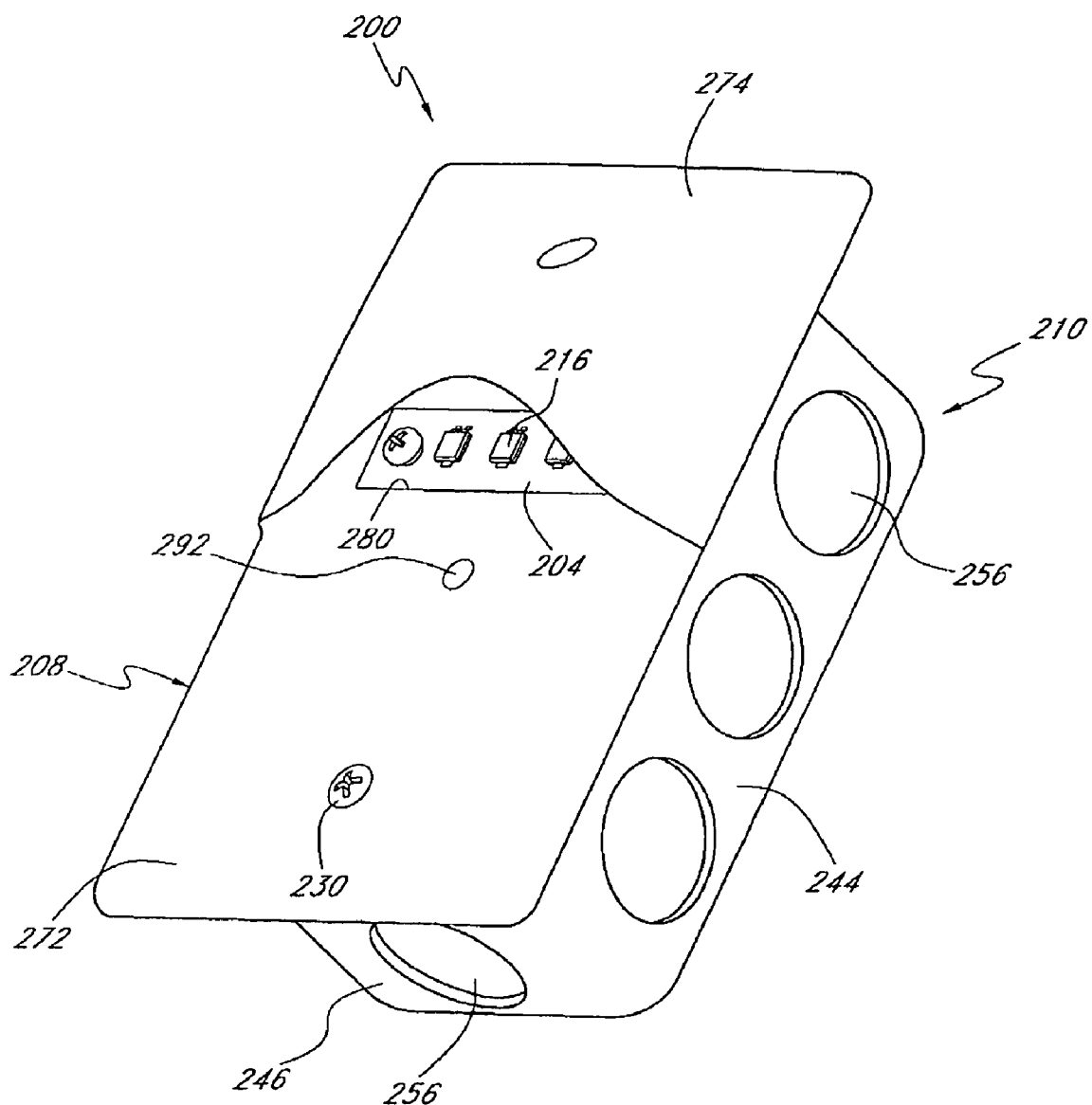
FIG. 27B is another perspective view of the assembled device of FIG. 25 showing the mounted LEDs.

With particular reference to FIGS. 25A and 27A-B, the heat dissipating plate 202 further includes mounting apertures 236 positioned to align with threaded mounting holes 238 found on typical electrical junction boxes 210. Electrical junction boxes 210 are well-known in the electrical art and are primarily used to safely contain electrical components, such as sockets and switches. A typical electrical junction box 210 is substantially rectangular in cross-section and is closed on five sides, the sixth side being open to receive the desired electrical components, and thus defines an internal cavity 240. For convenience, an electrical junction box 210 will be described as having a top 242, opposing sides 244, a bottom 246, and a back 248. The front of the box is typically left open to receive the desired electrical fixture. The front edges 250 of the top 242, sides 244, and bottom 246 define the front opening of the junction box 210. Some available junction boxes 210 do not incorporate a back 248, yet still define an internal cavity 240 defined by the sides and are contemplated as being usable in the embodiments disclosed herein.

As used herein, the terms electrical junction box, junction box, or electrical box, are used interchangeably and are broad terms. They each refer to any available product used for enclosing electrical connections in an electrical installation and are preferably formed of a heat conductive material, such as metal, but may be formed of other materials such as plastic. Preferably, a junction box 210 is selected that has a thermal conductivity of at least about 75 W/mK, and more preferably at least about 100 W/mK. Of course, junction boxes exhibiting other heat transfer properties can also be used with embodiments described herein. While typical commercially available electrical junction boxes are described herein, such descriptions should not be construed as limiting, but rather are used illustratively.

Electrical junction boxes generally are sized to accommodate one, two, three, or more electrical components mounted in a single junction box, and are defined in terms of "gangs". For example, single-gang boxes accommodate a single electrical component such as a light switch or electrical plug, while double-gang boxes typically accommodate two electrical components, and so on. Thus, junction boxes are configured with various widths to accommodate a desired number of electrical components. While the width is variable, the height is typically standard. The majority of electrical components adhere to an industry standard size, and so electrical junction boxes are sized to accommodate a wide variety of electrical components that adhere to the sizing standard. For example, typical junction boxes have a nominal height of about 4" plus or minus about 1". Typical widths of standard junction boxes are about 2" per gang, e.g. a double-gang box is about 4" wide, with a variation of about plus or minus about ½" per gang.

Many junction boxes 210 are about 1-3" deep, and are more commonly about 2" deep. With specific reference next to FIG. 25B, certain available products, commonly known as "mud plates" or "mud rings", are attachable to the front of a junction box 210 and effectively extend the depth of the junction box. It should be understood that such supplemental products, such as mud plates, are considered to be a part of the junction box for purposes of this application. In the embodiment shown in FIG. 25B, a mud plate 254 fits onto the junction box 210 and the heat dissipating plate 202 mounts to the mud plate 254.

Other typical junction boxes may be shaped in other polygonal arrangements, such as octagonal, circular, or otherwise. Some currently available hexagonal and octagonal junction boxes are about 3" to 4" in diameter and include at least one substantially flat side to facilitate mounting to a flat surface.

Electrical junction boxes 210 are typically formed of metal, such as aluminum or other metals and alloys, but may also be formed of other materials. In addition, junction boxes 210 sometimes include nail guides, and even nails ready to be driven through a junction box mount into the supporting building framework. During construction, junction boxes 210 are mounted to wooden or metal studs, such as by nails. As such, at least one of the sides of the junction box 210 is typically substantially flat to provide surface contact with the surface of a stud or other supporting framework to encourage a secure mounting of the junction box 210. Some junction boxes may incorporate mounting flanges to assist in mounting in addition to or in lieu of a substantially flat side.

With continued reference to FIGS. 25A-B and 27A-B, junction boxes 210 are further configured to receive electrical wires that supply electricity to the electrical components ultimately to be housed within the junction box 210. More specifically, electrical boxes are typically configured with a plurality of knock outs 256 that allow an electrician to selectively route the electrical wires that need to enter the electrical box 210 and connect to the electrical components therein. A knock out 256 is a partially lanced portion of the electrical box material that maintains connection to the box 210 only at a relatively small portion of its periphery. A knock out 256 allows easy entry to the box by deforming the knock out to expose the hole created by lancing around the majority of the knock out 256. Alternatively, the knock out 256 may be completely removed from the junction box 210, thereby exposing an opening through which electrical wires may be routed. Knock outs 256 are typically ½" to ¾" in diameter, and may be larger or smaller depending on the particular purposes for the junction box.

In the embodiment illustrated in FIG. 25A, a rectangular electrical junction box 210 is provided including two mounting flanges 258 extending from the top 242 and bottom 246, respectively. Each mounting flange 258 is configured with a hole 238, typically a threaded hole, configured to receive a threaded fastener 230 to secure a fixture thereto. In the illustrated embodiment the heat dissipating plate 202 is configured to attach to the junction box 210 at the mounting flanges 258, by threaded fasteners 230. As such, the heat dissipating plate 202 is in intimate surface contact with the junction box 210 at least at the mounting flanges 258, and preferably along at least a portion of the front edge 250 of the junction box 210. Heat generated by the LEDs is transferred to the heat dissipating plate 202, and further to the electrical junction box 210. As such, the plate 202 and electrical junction box 210 function as heat sinks for the LEDs.

The illustrated embodiment utilizes a relatively large surface area of heat conductive material to dissipate heat generated by the LEDs. As such, the material chosen for the heat dissipating plate 202 preferably conducts heat away from the LEDs efficiently so that the LEDs stay within their desired temperature operating parameters, even if they are driven at a higher-than-recommended current.

In typical building construction, voltage is supplied at either 120 VAC or 220 VAC. Other building power sources can include batteries run at various voltages such 12 VDC. Electrical wires are customarily routed through walls and are connected to electrical components mounted in junction boxes 210. In the illustrated embodiment, the driver 206 includes a power converter module 260. The power converter module 260 is configured to accept the incoming electrical voltage and/or current, whether at 120 VAC, 220 VAC, or otherwise, and convert the electricity to a desired voltage, such as 3 VDC, 9 VDC, 12 VDC, or other voltage suitable for the intended LED application, and to supply the voltage within a desired current range.

In addition to converting the incoming power to a desired voltage, the driver 206 preferably is configured to control the light intensity of the apparatus. More particularly, in the illustrated embodiment, the driver 206 is configured to pulse the LEDs at a rate imperceptible to the human eye. For example, preferably the LEDs are driven at about 300 Hz or more. In the illustrated embodiment, the brightness of the LEDs is varied by controlling the duty cycle. Preferably the driver 206 incorporates a duty cycle controller such as a pulse width modulator.

The duty cycle is defined as the percentage of time the LED is illuminated during a given cycle or pulse. During a pulse cycle, an LED is first pulsed "on" to be illuminated and then turned "off" so that it is no longer illuminated. One cycle is defined as the period from when an LED is first turned "on" until immediately before it is turned "on" again. The LED may be illuminated for any desired portion of the duty cycle. For example, the LED may be illuminated for 10%, 20%, 50%, 60%, 80%, and up to 100% of the cycle. Hence, for a given frequency, the duty cycle is measured as the percentage of the cycle time during which the LED is illuminated. Accordingly, a low duty cycle may be about 20% or lower, while a high duty cycle may be around 70% or higher. In applications in which a higher intensity light is desired, such as spot lighting or channel lighting, the LEDs preferably are driven at a high duty cycle, such as about 80%, or higher, thus producing a more intense light than a control strategy using a lighter duty cycle.

The duty cycle may be controlled by a manual control or may be automatically controlled according to predetermined parameters. Also, various structures and methods can be used for varying the light output of the LEDs. For example, a rheostat, potentiometer, variable resistor or the like can be used. In one embodiment, the driver comprises a manual DIP switch is configured to selectively control the duty cycle of pulsed LEDs. In preferred embodiments, one or more sensors are configured to detect environmental parameters, and the driver is configured to evaluate sensor inputs and drive the LEDs according to a predetermined control strategy.

With reference to FIGS. 25 and 27A-B, the cover plate 208 shields the LEDs from direct view from certain directions. For example, the LEDs cannot be directly viewed from above or straight ahead. Instead, light from the LEDs is directed generally downwardly, and is shielded from view from other directions. Of course, it is to be understood that the lighting fixture can be mounted in other configurations so that the light is directed in different directions. For example, the fixture can be mounted so light is directed generally upwardly, such as in sconce-type lighting.

The cover plate 208 may be formed of any suitable material, such as metal or polymers. Most preferably it is formed of a heat conductive material such as aluminum. As such, the cover 208 helps to conduct heat from the LEDs 216 to the environment, and can function as a heat sink. The cover plate 208 preferably comprises a plurality of mounting holes 270 that are positioned to coincide with the mounting holes 236, 238 formed in both the heat dissipating plate 202 and the junction box 210. In one preferred embodiment, screws 230 pass through the mounting holes 270 in the cover plate 208, the mounting apertures 236 in the heat dissipating plate 202, and are threaded into the holes 238 formed in the junction box mounting flanges 258. Of course, other mounting methods are possible, and the disclosed mounting configuration is illustrative of a single contemplated mounting arrangement.

With particular reference to FIG. 27A-B, the illustrated cover plate 208 includes a flat portion 272 and a hood portion 274. The flat portion 272 preferably comprises a lip 276 that extends rearwardly and fits complementary about the heat dissipating plate 202. Moreover, in some embodiments, the lip 276 is configured to rest flush against a wall of a building and thereby provide an aesthetically pleasing flush-mounted look to the device. As best shown in FIG. 27B, the flat portion 272 preferably includes a cutout 280 configured to accommodate the LED module 204. Preferably, the cover plate 208 fits tightly against the heat dissipating plate 202 so that heat can flow readily between the plates.

The hood 274 is preferably configured to direct the light from the LEDs in a desired direction and to limit direct view of the LEDs from certain directions. For example, as illustrated, the hood 274 is configured to allow the light from the LEDs to shine generally downwardly, while prohibiting direct view of the LEDs from above. The hood 274 may be integrally formed with the cover plate 208, or it may be formed as a separate attachable component. For example, in one embodiment, the hood 274 is formed as a separate component and has a securing structure that cooperates with the lip 276 of the flat portion 272 to allow the hood 274 to slide downwardly onto the flat portion 272. A mounting screw 230 then passes through the mounting hole in the hood 274 and also through the mounting aperture 270 in the flat portion 272 to keep the components aligned. By configuring the hood 274 as a separate removable component, the LEDs are easily accessible for repair or replacement simply by removing a single screw 230 and then removing the hood 274.

Figure 31:
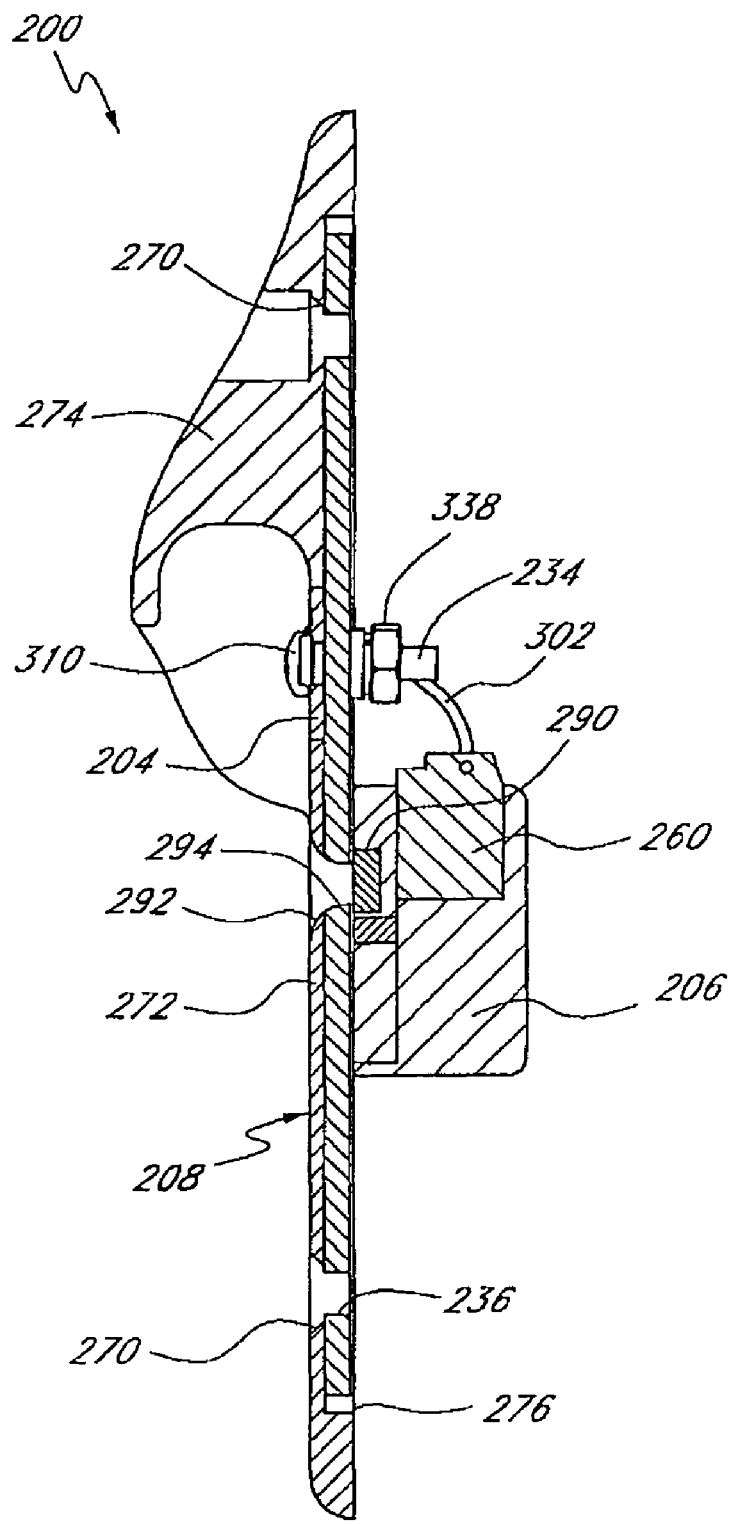
FIG. 31 is a side elevational view of another embodiment of a lighting device.

With reference next to FIG. 31, in accordance with another preferred embodiment, the driver 206 comprises a sensor 290 adapted to sense environmental conditions. Depending on the conditions sensed, the driver 206 controls the LEDs 216 according to a predetermined control strategy. In the illustrated embodiment, the cover plate 208 and heat dissipating plates 202 each incorporate sensor apertures 292, 294 to allow light to access the sensor 290 disposed on the driver 206.

The sensor 290 can be any type of sensor configured to detect any of a desired number of environmental parameters, or can comprise two or more different types of sensors. For example, in some embodiments, the sensor is a light sensor configured to detect the intensity of environmental light. As used herein, environmental light is used to refer to light emanating from outside the lighting device, such as natural light from the sun, or light from other lighting sources. In one embodiment, when the environmental light intensity falls below a predetermined minimum, the sensor sends a signal to a duty controller that controls the brightness of the LEDs according to a predetermined control strategy.

According to another embodiment, the apparatus comprises a motion sensor. Thus, when the sensor detects motion within a zone of coverage, the sensor sends a signal to the duty controller, which then increases the duty cycle of the LEDs to provide increased light to an otherwise dimly lit or unlit environment. For example, in one embodiment a plurality of LED luminaires 200 are installed in a hallway and when a person enters the dark hallway at night, the plurality of lighting devices will sequentially light up as the person progresses through the hallway, thereby providing sufficient light to an otherwise dark passageway.

In another embodiment, the duty controller is configured to drive the LEDs at a low duty cycle to provide a small amount of light to an area until the motion sensor detects motion, at which time the duty controller increases the duty cycle to provide an increased intensity light.

In still another embodiment, the sensor comprises a light sensor adapted to detect only certain wavelengths of light. More specifically, the sensor does not detect the wavelength of light emitted by the LEDs of the LED module. Thus, light emitted by the LEDs is not detected by the sensor. In one embodiment employing such a sensor, when the intensity of the environmental light detected by the sensor falls below a threshold level, the driver illuminates the LEDs. Thus, the LEDs effectively provide a night light.

In a still further embodiment, the light sensor just discussed is combined with a motion sensor as discussed above to provide an LED luminaire that provides dim illumination at night or when environmental lighting conditions are low, and provides relatively bright illumination when a person is in proximity to the lights. Further, in other embodiments, one or more LED luminaires can be linked together to be actuated by a remote sensor and/or driver that is configured to drive and control all of the linked-together illumination devices.

In accordance with another preferred embodiment, an illumination apparatus having features as discussed above is powered by a primary power source, and is also connected to a secondary power source. Preferably the secondary power source is a backup power source, such as a battery. In normal operation the apparatus is powered by the primary power source. Preferably, the driver comprises a DIP switch that sets the LEDs to run at a first brightness level at a default setting when powered by the primary power source. The driver is configured to sense when or if the power supply switches from the primary to the secondary power source, thus indicating a possible emergency condition. When such a condition is sensed, the DIP switch is actuated to set the LEDs to illuminate at a second brightness, preferably the full brightness of the LEDs, so as to act as emergency lighting. In one embodiment, the primary power source is provided at about 12 VAC and the secondary power source is provided at 12 VDC. When the change from AC to DC power supply is sensed, the DIP switch is triggered. Of course, it is to be understood that other power source configurations and sensing means can be employed. Moreover, more than one type of sensor may be employed.

In a still further embodiment, the driver is configured to receive a signal from an emergency system, such as a fire alarm or other type of emergency notification system. When the driver detects a signal from the emergency system, the driver drives the LEDs according to a predetermined strategy, such as at full brightness and/or slowly flashing.

Figure 28:
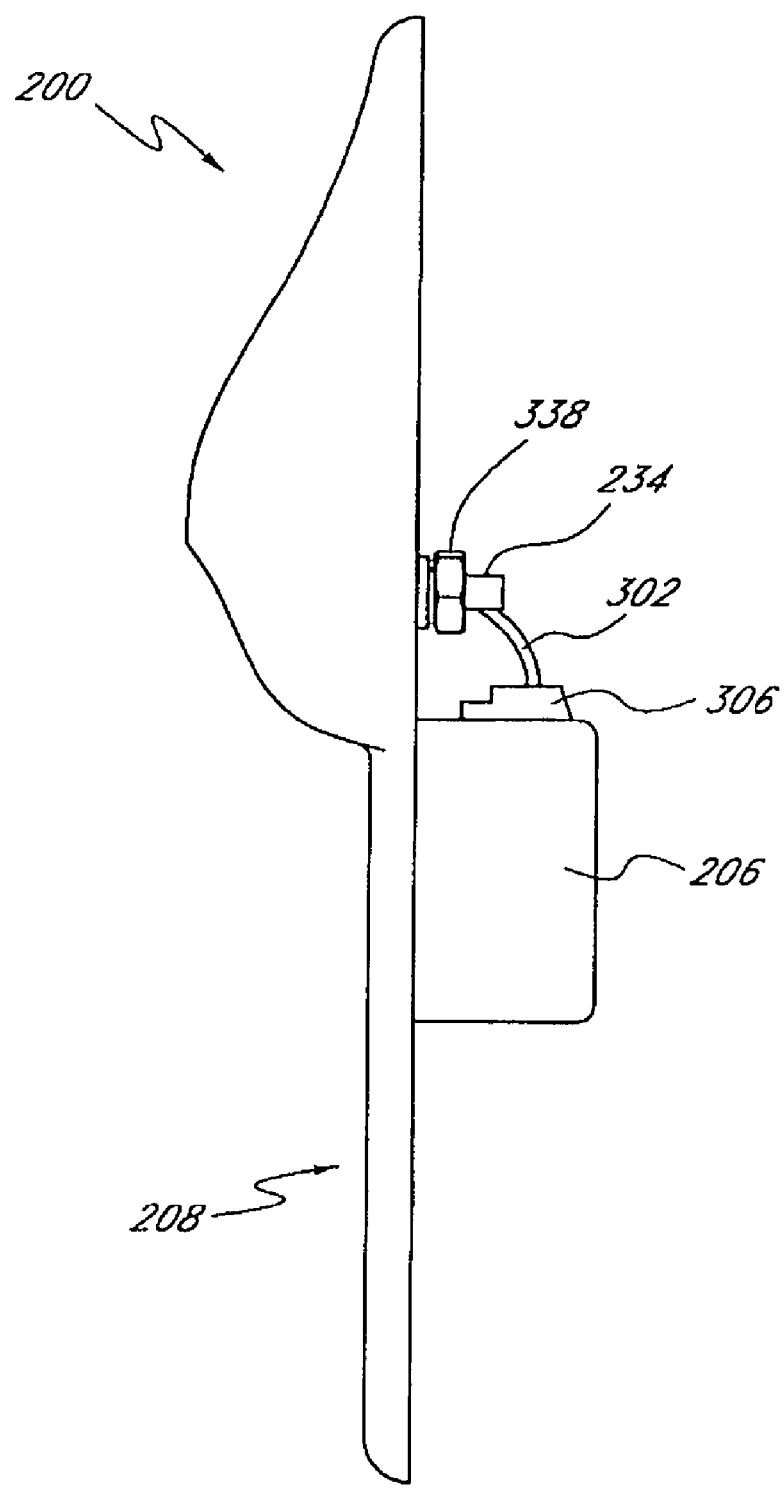
FIG. 28 is a side elevational view of a lighting device configured to mount in an electrical junction box.
Figure 29:
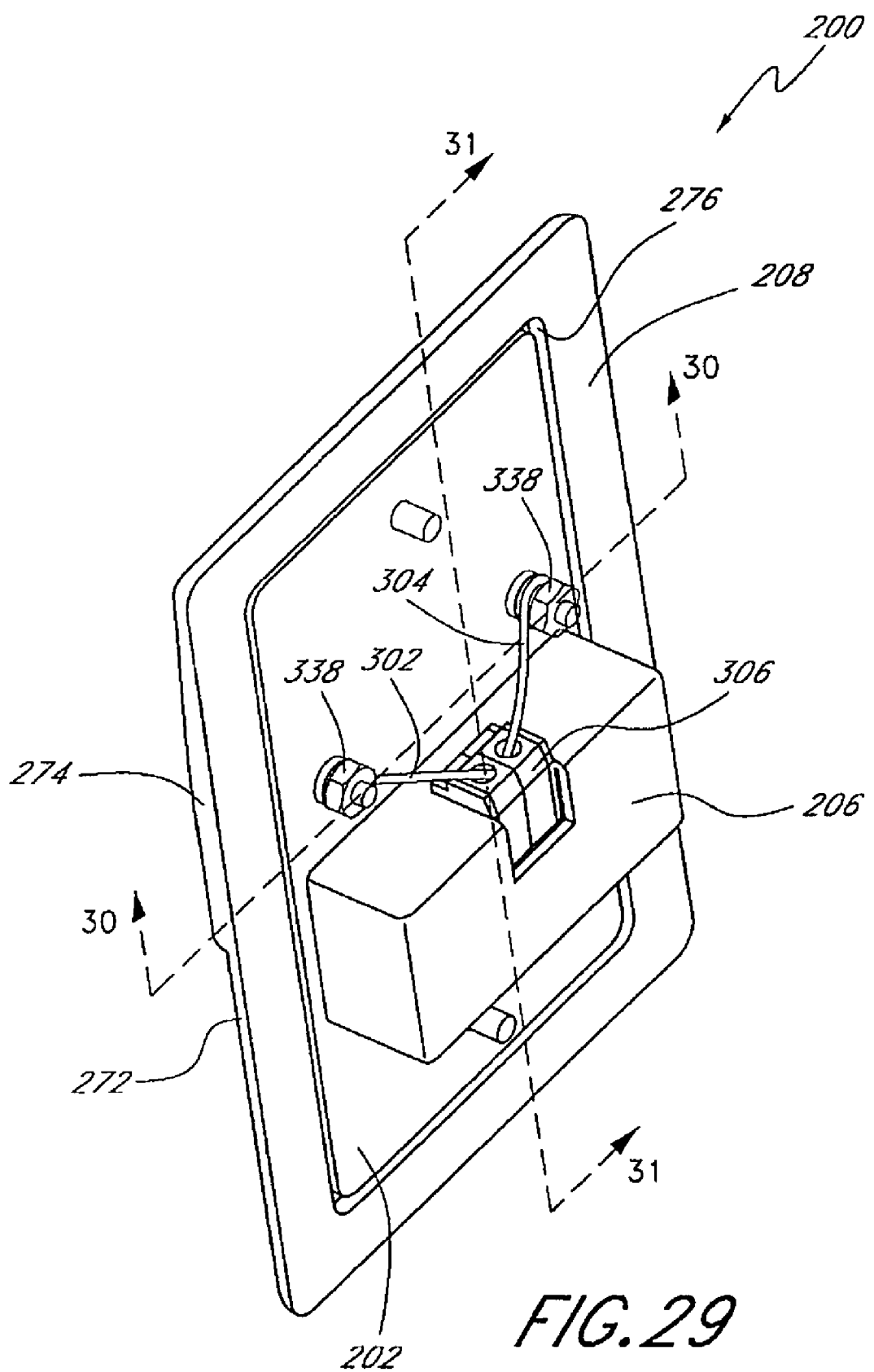
FIG. 29 is a rear perspective view of the device of FIG. 28.

With reference to FIGS. 28 and 29, the driver 206 is securely attached to a rear side of the heat dissipating plate 202. This may be accomplished through any of a number of fastening methods, such as screws, adhesives, heat bonding, or other mechanical or chemical bonding techniques. The driver 206 is preferably covered by a housing 300 to protect the internal components. The housing 300 may be formed of any of a number of suitable metals or polymers.

A pair of wires 302, 304 extend from within the driver 206 and connect to the LED module 204, as will be described below. In one embodiment, the wires 302, 304 are connected to connectors 306 disposed on the housing 300 and allow for quick electrical connection to the driver 206. In other embodiments, the wires 302, 304 may be permanently connected to the driver in any suitable manner. Preferably, the electrical wires are connected directly to the power converter portion 260 of the driver 206. The power converter 260 converts the supplied power to a desired voltage and current. In another embodiment, the driver supplies power directly to circuit traces formed on the LED module without using wires.

Figure 30:
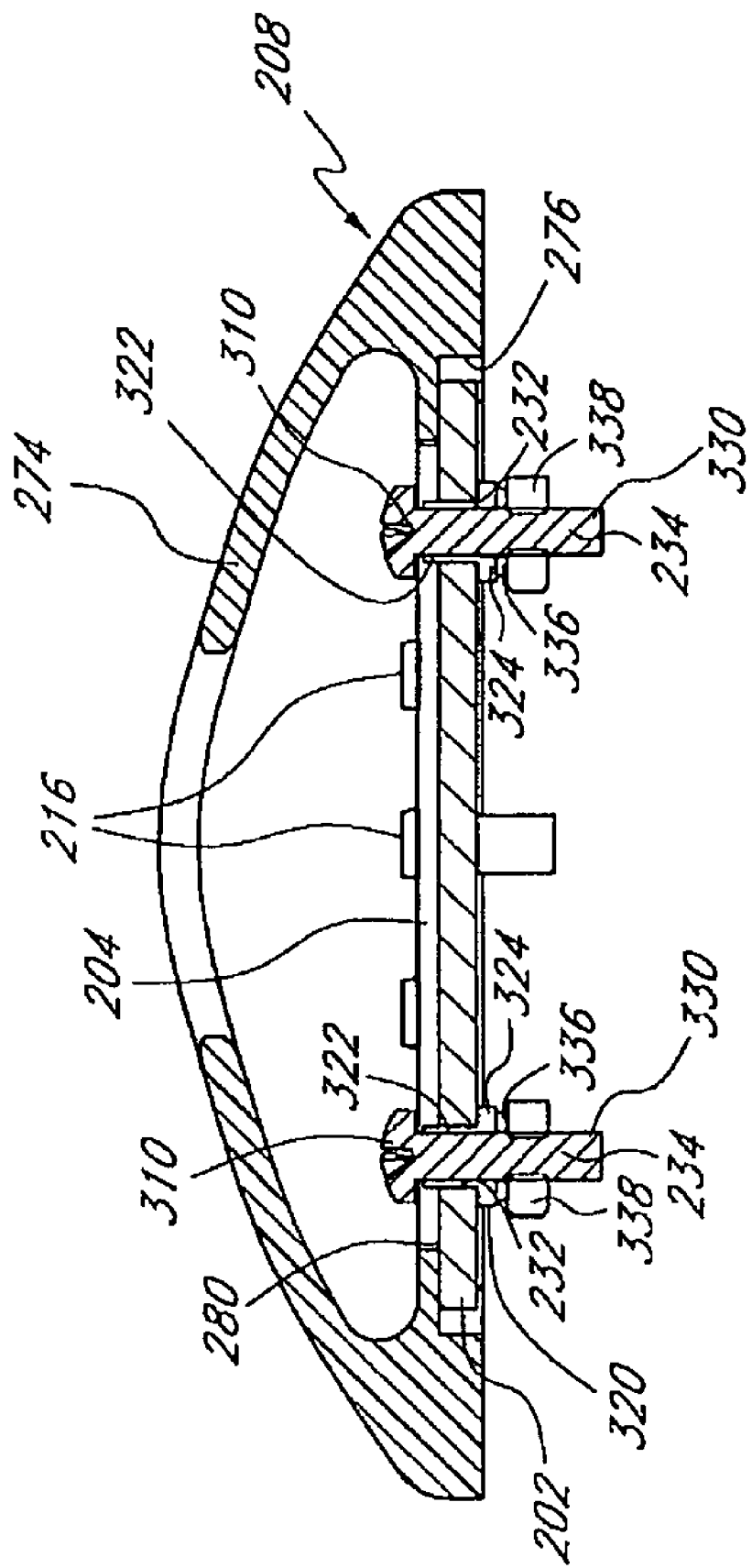
FIG. 30 is a cross sectional view of the device of FIG. 29 taken along the line 30-30.

With particular reference to FIGS. 25, 29 and 30, the LED module 204 preferably is secured to the heat dissipating plate 202 by a plurality of threaded fasteners 234. The threaded fasteners 234 each have a head portion 310. When the threaded fasteners 234 are fully inserted into mounting holes 222, the head portions 310 make electrical contact with respective positive and negative contacts 312, 314 of the module 204.

Inserts 320 are configured to fit through the dissipating plate apertures 232. Preferably, each insert 320 comprises a shank portion 322 and flange portion 324. The shank 322 is configured to fit through the heat dissipating plate and module apertures 232, 222. Further, the shank 322 is configured to accept the corresponding threaded fastener 234 therethrough. Since the inserts 320 are electrically non-conductive, the inserts 320 electrically insulate the threaded fasteners 234 from the heat dissipating plate 202 and the body of the LED module 204. In one embodiment, the inserts 320 are threaded so as to engage the fasteners 234. In a still further embodiment, the inserts are threaded about the outer surface of the shanks so as to fit and correspond with threads formed in one or more of the apertures 222, 232.

With particular reference to FIG. 25, the shanks 330 of the threaded fasteners 234 extend through the LED module 204, heat dissipating plate 202, and inserts 320. In the illustrated embodiment, a lock washer 336 is disposed over the fastener 234, and a nut 338 securely holds the threaded fastener 234 in place. As such, the LED module 204 is held securely onto the heat dissipating plate 202, and the fasteners 234 provide conductive paths from the rear side of the plate 202 to positive and negative contacts 312, 314 of the module 204, which is positioned on a front side of the plate 202.

With more specific reference to FIGS. 28-30, supply wires 302, 304 extend from the driver 206 to the threaded fasteners 234. The wires preferably are attached to the fasteners 234 by being crimped between the nut 338 and the washer 336.

In still another embodiment, the fasteners 234 can directly engage threaded receivers that are embedded or formed within the driver. Within the driver module the threaded receivers can be attached to the power converter so that, rather than using external wires, power is supplied directly from the driver to the fasteners and further to the LED module.

The illustrated configuration allows the heat dissipating plate 202 and the driver 206 to comprise a modular assembly, which can be quickly and easily used with any of a variety of LED modules 204. In one embodiment, the heat dissipating plate 202 and driver 206 are preassembled and prepackaged. This assembly is then installed into a junction box during the wiring phase of building construction. Subsequently, LED modules can be chosen and mounted to the heat dissipating plates 202 with the mounting screws 234 completing the electrical connection between the LED module and the driver 206. Additionally, the LED module can be quickly removed and replaced without having to remove the heat dissipating plate from the driver. Of course, other types of electrical connection are possible and are contemplated as being within the scope of the appended claims.

As shown in FIG. 31, the apertures 270 through the cover plate 208 are preferably countersunk to inhibit a screw head from extending beyond the surface of the cover plate.

Many of the embodiments described herein can be installed into existing junction boxes previously installed in a building. In one embodiment a wall-mounted electrical outlet is removed and a lighting apparatus having aspects as discussed above is installed in its place. As such, existing building junction boxes can be readily retrofit with embodiments having features as described herein.

In another embodiment of a lighting device, the hood 274 additionally includes a lens cover configured to diffuse the light emitted by the LEDs. In addition, the lens cover further protects the LEDs from contact with outside debris, which may interfere with proper electrical operation or otherwise shorten their useful life. Of course, any type or shape of hood can be incorporated into the present lighting device to provide any of a number of desired aesthetic or functional characteristics.

There are a wide variety of contemplated uses for embodiments of the disclosed lighting device. For example, an additional embodiment of the described lighting device includes an exposed adhesive, such as fly paper, to capture insects as they are drawn toward the light emitted by the LEDs. The fly paper can be removed and replaced for continued insect abatement. Such an embodiment preferably employs LEDs that emit UV light.

Other contemplated commercial embodiments can combine the lighting device with other electrical components. For example, a single-gang electrical box can house both a lighting device and an electrical outlet. In this particular embodiment, the upper portion of the electrical component can be configured with the lighting device as described herein, while the lower portion of the electrical component can be configured with a single electrical outlet or switch. This is particularly suitable for use as a permanent night light, and preferably includes a twilight sensor to trigger an appropriate duty cycle to selectively illuminate the LEDs.

In the illustrated embodiment, the heat dissipating plate has been depicted as rectangular and generally flat. It is to be understood that in other embodiments, other shapes and configurations of such a heat dissipating plate can be employed. For example, the plate can have other polygonal shapes, preferably which correspond to the shape of the junction box. Further, in another embodiment, the heat dissipating plate comprises one or more heat dissipating fins in order to help dissipate heat from the plate.

Figure 32:
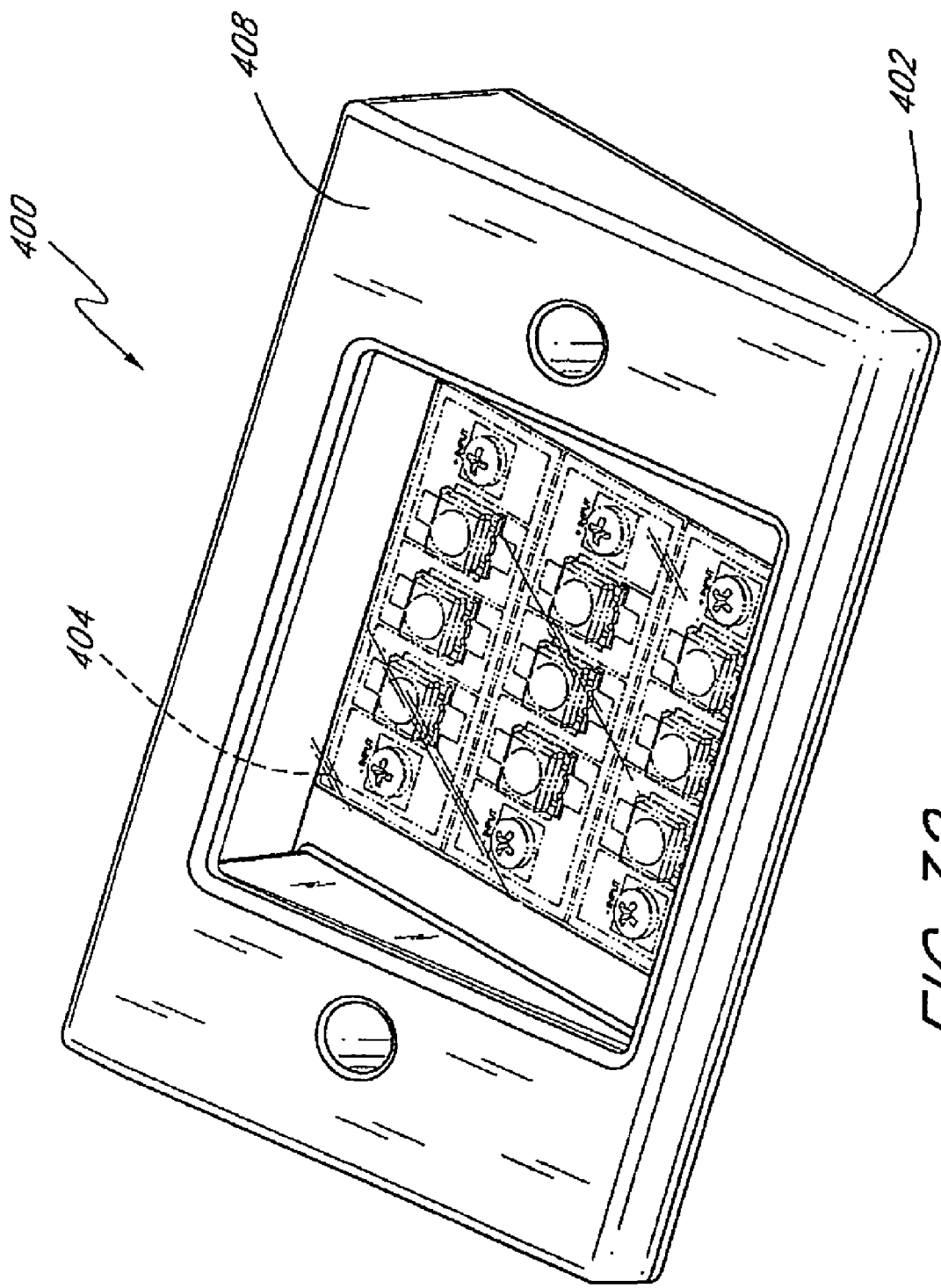
FIG. 32 is a perspective view of another embodiment of an LED luminaire.
Figure 33:
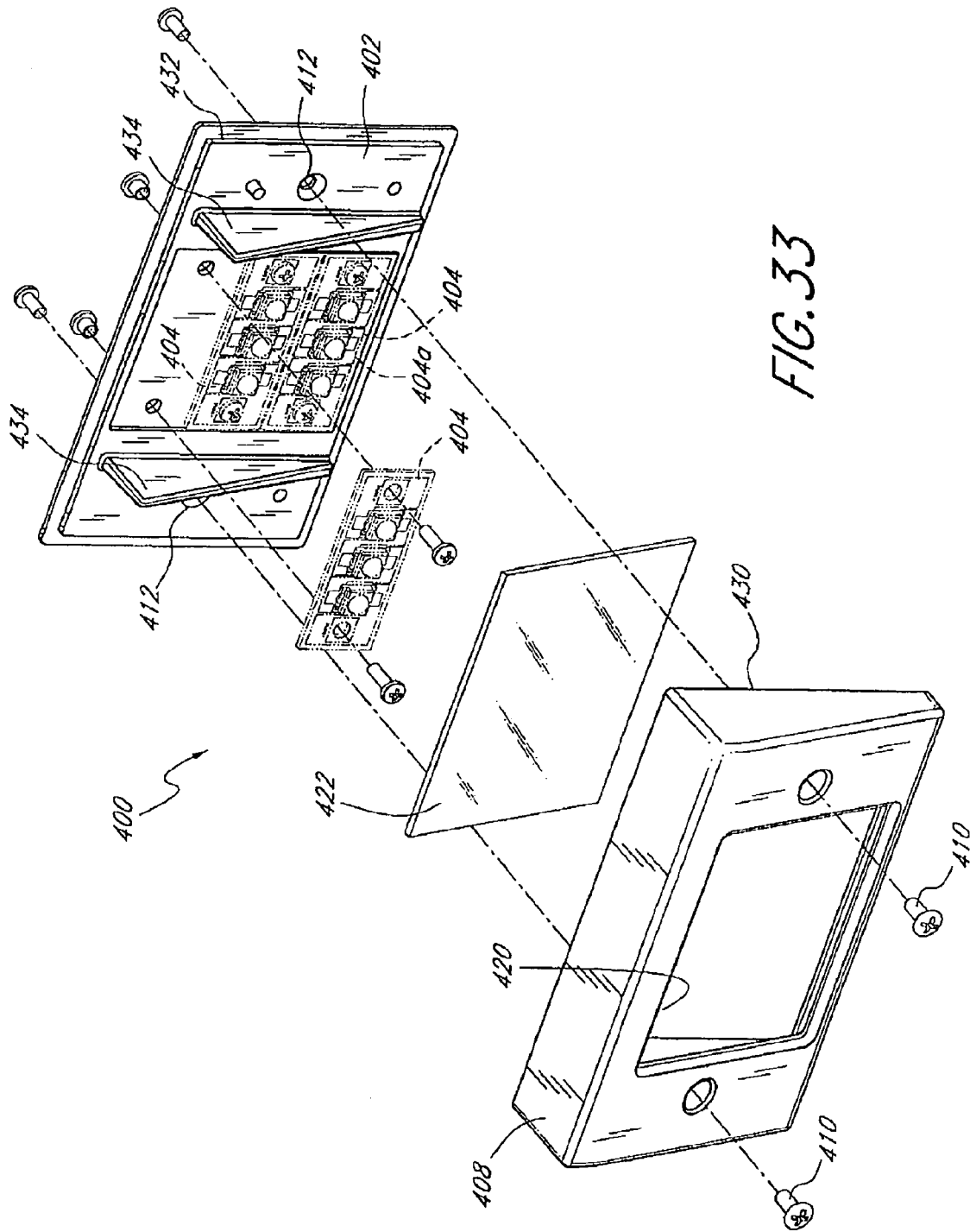
FIG. 33 is an exploded view of the embodiment shown in FIG. 32.

With reference next to FIGS. 32 and 33, another embodiment of an LED luminaire 400 is provided. The LED luminaire 400 comprises a heat dissipating base plate 402 upon which a plurality of LED modules 404 can be mounted. The LED modules 404 preferably are connected to the base plate 402 via threaded fasteners 410 that extend through apertures 412 formed in both the module 404 and the base plate 402. A cover plate 408 fits over the LED modules 404 and heat dissipating plate 402. The cover plate 408 has an illumination aperture 420 that generally aligns with the LED modules 404 so that light from the modules passes through the illumination aperture 420. Preferably a lens or diffuser 422 extends across the illumination aperture 420 of the cover 408.

With particular reference to FIG. 33, a back edge 430 of the cover plate is configured to complementarily fit onto a guide ridge 432 of the heat dissipating plate 402. Further, the heat dissipating plate 402 preferably has guides 434 that help position the cover plate 408 accurately adjacent the heat dissipating plate 402.

In the illustrated embodiment, the cover plate 408 is configured so that the diffuser 422 is disposed at an acute angle relative to the dissipating plate 402. It is to be understood that in other embodiments, the diffuser 422 need not be angled, or can be angled in other directions and manners.

As illustrated, the embodiment disclosed in FIGS. 32 and 33 employs more than one LED module 404. Correspondingly the apparatus can include more than one driver so that each LED module can be controlled independent of the others. In the illustrated embodiments, a single driver concurrently controls all three modules. In further embodiments, different modules 404 employ LEDs having different colors, and the modules are independently controlled so that, depending upon environmental conditions or other inputs, only a specific color is displayed at any one time by selectively illuminating LED modules.

It is to be understood that, in another embodiment, instead of employing three LED modules 404 as shown, one of the modules may comprise a sensor module 404a, which comprises a module having a sensor and associated logic circuitry. The sensor communicates with the driver in a similar manner as in the embodiments disclosed above in connection with FIGS. 25 to 31, however there is no need for an aperture formed through the plate 402.

In the illustrated embodiments discussed above, the LED module 204 is formed separately from the heat dissipating plate 204 and is attached to the plate. It is to be understood that, in other embodiments, an LED module may be conformed with the heat dissipating plate 204. In one such embodiment, a dielectric layer is formed on a portion of the plate 202, and contacts are disposed on the dielectric layer. LEDs are then arranged on the contacts in an electrically-connected array. Power may be supplied to the LEDs by wires or another conductor extending between the module and a power supply.

Although this invention has been disclosed in the context of certain preferred embodiments and examples, it will be understood by those skilled in the art that the present invention extends beyond the specifically-disclosed embodiments to other alternative embodiments and/or uses of the invention and obvious modifications and equivalents thereof. For example, the LEDs can be wired in either a series or parallel array. Likewise, multiple LED packages can also be wired either in series or parallel. In addition, while a number of variations have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed modular arrangement and method. Thus, it is intended that the scope of the present invention should not be limited by the particular disclosed embodiments described above, but should be determined only by a fair reading of the claims that follow.

What is claimed is:

1. A lighting apparatus, comprising:
   a light emitting diode (LED) module having:
      at least one LED;
      a heat conductive base having opposing first and second sides, and having first and second apertures formed therethrough;
      a dielectric member disposed on the first side of the base; and
      a plurality of electrically conductive contacts disposed on the dielectric member, the contacts configured to mount the at least one LED so that an electrical current path is defined between a first contact and a second contact, and the at least one LED is disposed along the current path;
   a heat conductive member having a first side and a second side, the heat conductive member having first, second and third apertures formed therethrough and having a mount surface defined on the first side;
   a power driver adapted to receive an electrical input power, condition the power to a desired power configuration, and output conditioned power between first and second nodes;
   wherein the LED module is attached to the mount surface on the first side of the heat conductive member so that the second side of the heat conductive base enagages the mount surface and the power driver is disposed on or adjacent the second side of the heat conductive member so that the heat conductive member is sandwiched between the LED module and the power driver, the base arranged on the heat conductive member so that the first and second apertures of the base are aligned with the first and second apertures, respectively, of the heat conductive member, and the third aperture of the heat conductive member is spaced from the LED module;
   a first elongate conductive member extending from the first node through the aligned first apertures of the base and heat conductive member and being electrically connected to the first contact of the LED module; and
   a second elongate conductive member extending from the second node through the aligned second apertures of the base and heat conductive member and being electrically connected to the second contact of the LED module;
   wherein the driver is electrically connected to the LED module so that conditioned power is supplied across the first and second contacts.

2. The lighting apparatus of claim 1 additionally comprising a heat sink having a mount aperture, the heat conductive member third aperture being aligned with the heat sink mount aperture, and a fastener engaging the apertures to secure the heat conductive member to the heat sink.

3. The lighting apparatus of claim 2, wherein the heat sink comprises a plurality of side walls, and the heat conductive member and heat sink side walls together define a cavity, and wherein the driver is disposed in the cavity.

4. The lighting apparatus of claim 3, wherein the heat sink additionally comprises a back wall configured to enclose the cavity.

5. The lighting apparatus of claim 3 additionally comprising an opening formed through at least on of the heat sink side walls, and a power supply wire extends through the opening and connects to the driver so as to supply electric power to the driver.

6. The lighting apparatus of claim 3, wherein the heat sink side walls define a front periphery, and the heat sink front periphery abuts the second side of the heat conductive member.

7. The lighting apparatus of claim 6, wherein the heat sink comprises a secondary mount member configured to attach the heat sink to a structure.

8. The lighting apparatus of claim 6 additionally comprising a second heat sink connected to the heat conductive member so as to abut the first side of the heat conductive member.

9. The lighting apparatus of claim 8, wherein the second heat sink comprises a hood generally aligned with the LED module and adapted to direct light from the LED module in a desired direction.

10. A lighting apparatus, comprising:
    a light emitting diode (LED) module having:
       at least one LED;
       a heat conductive base
       a dielectric member disposed on a first side of the base; and
       a plurality of electrically conductive contacts disposed on the dielectric member, the contacts configured to mount the at least one LED so that an electrical current path is defined between a first contact and a second contact, and the at least one LED is disposed along the current path;
    a first heat sink having opposing first and second sides, the first heat sink having first and second spaced apart apertures formed therethrough and having a mount surface defined on the first side;
    a power driver adapted to receive an electrical input power, condition the power to a desired power configuration, and output conditioned power between first and second nodes;
    wherein the LED module is attached to the mount surface on the first side of the first heat sink so that a second side of the LED module heat conductive base engages the mount surface, and the power driver is disposed on or adjacent the second side of the first heat sink;
    a second heat sink attached to the first heat sink, the first and second heat sinks cooperating to define a cavity having front and side surfaces, the power driver being disposed in the cavity;
    a first elongate conductive member extending from the first node through the first aperture in the first heat sink and being electrically connected to the first contact of the LED module; and
    a second elongate conductive member extending from the second node through the second aperture in the first heat sink and being electrically connected to the second contact of the LED module;
    wherein the driver is electrically connected to the LED module so that conditioned power is supplied across the first and second contacts.

11. The lighting apparatus of claim 10, wherein the heat conductive base has first and second spaced apart apertures that are aligned with the first and second apertures, respectively, of the first heat sink, and wherein first and second elongate fasteners extend through respective first and second apertures to secure the LED module to the first heat sink, the first and second fasteners engaging respective first and second contacts of the LED module and being electrically spaced from the first heat sink.

12. The lighting apparatus of claim 10, wherein the second heat sink comprises at least one opening formed through a wall thereof so as to provide access to the cavity, and a power supply wire extends through the opening.

13. The lighting apparatus of claim 10 additionally comprising a third heat sink attached to the first side of the first heat sink about the periphery of the LED module, the third heat sink comprising a hood configured to direct light from the LED module in a desired direction.

* * * * *